(12) United States Patent
Mochizuki et al.

(10) Patent No.: US 10,164,447 B2
(45) Date of Patent: Dec. 25, 2018

(54) SEMICONDUCTOR CHIP, SEMICONDUCTOR DEVICE AND BATTERY PACK

(71) Applicant: Renesas Electronics Corporation, Tokyo (JP)

(72) Inventors: Keita Mochizuki, Tokyo (JP); Kensuke Nakashima, Tokyo (JP); Takahiro Korenari, Tokyo (JP); Kouji Nakajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 281 days.

(21) Appl. No.: 14/946,680

(22) Filed: Nov. 19, 2015

(65) Prior Publication Data
US 2016/0254809 A1 Sep. 1, 2016

(30) Foreign Application Priority Data

Feb. 26, 2015 (JP) .................................. 2015-036833
Jul. 10, 2015 (JP) .................................. 2015-138827

(51) Int. Cl.
| | |
|---|---|
| *H02J 7/00* | (2006.01) |
| *H01L 27/088* | (2006.01) |
| *H01L 27/02* | (2006.01) |
| *H01M 10/44* | (2006.01) |
| *H01L 21/8234* | (2006.01) |

(52) U.S. Cl.
CPC ........ *H02J 7/0026* (2013.01); *H01L 27/0207* (2013.01); *H01L 27/088* (2013.01); *H01M 10/44* (2013.01); *H01L 21/823487* (2013.01); *H01L 2224/48091* (2013.01); *H01L 2224/73257* (2013.01); *H02J 7/0031* (2013.01); *H03K 2217/0054* (2013.01)

(58) Field of Classification Search
CPC . H03K 17/6871; H01L 27/088; H02J 7/0026; H02J 7/0072; H02J 2007/0037; H02J 2007/004; H02J 7/0031
USPC ................................ 320/112, 127, 134, 137
See application file for complete search history.

(56) References Cited

U.S. PATENT DOCUMENTS

| | | | | |
|---|---|---|---|---|
| 5,629,542 | A | * 5/1997 | Sakamoto | ........... H01L 27/0629 257/146 |
| 5,909,103 | A | * 6/1999 | Williams | .............. H02J 7/0031 320/134 |
| 6,653,740 | B2 | 11/2003 | Kinzer et al. | |
| 2006/0263988 | A1* | 11/2006 | Takahashi | ......... H01L 23/49562 438/286 |
| 2007/0296081 | A1* | 12/2007 | Lee | ..................... H01L 23/3171 257/737 |

(Continued)

FOREIGN PATENT DOCUMENTS

JP 4646284 B2 3/2011

*Primary Examiner* — Paul Dinh
(74) *Attorney, Agent, or Firm* — McGinn I. P. Law Group, PPLC.

(57) ABSTRACT

To provide a semiconductor product high in versatility.
A common drain pad is formed over the surface of a semiconductor chip together with source pads and gate pads of discharging and charging power transistors. Thus, when the semiconductor chip is face-down mounted over a wiring board, not only the source pads and gate pads of the discharging and charging power transistors, but also the common drain pad is electrically coupled to wirings of the wiring board.

6 Claims, 28 Drawing Sheets

(56) References Cited

U.S. PATENT DOCUMENTS

| | | | | |
|---|---|---|---|---|
| 2008/0121995 A1* | 5/2008 | Anderson | ......... | H01L 29/66681 |
| | | | | 257/356 |
| 2010/0327976 A1* | 12/2010 | Klemens | ............... | H01L 23/645 |
| | | | | 330/277 |
| 2012/0169367 A1* | 7/2012 | Kuo | ................... | G01R 1/06772 |
| | | | | 324/756.03 |
| 2014/0009189 A1* | 1/2014 | Mauder | ................ | H03K 17/687 |
| | | | | 327/109 |
| 2014/0146435 A1* | 5/2014 | Stephanou | ............... | H01G 5/18 |
| | | | | 361/290 |
| 2016/0035653 A1* | 2/2016 | Niu | ................... | H01L 23/49562 |
| | | | | 257/368 |

\* cited by examiner

SEMICONDUCTOR CHIP, SEMICONDUCTOR DEVICE AND BATTERY PACK

CROSS-REFERENCE TO RELATED APPLICATIONS

The disclosure of Japanese Patent Application No. 2015-138827 filed on Jul. 10, 2015 and No. 2015-036833 filed on Feb. 26, 2015 including the specification, drawings and abstract is incorporated herein by reference in its entirety.

BACKGROUND

The present invention relates to a semiconductor chip, a semiconductor device, and a battery pack, and to a technology effective for application to, for example, a semiconductor chip and a semiconductor device used in control of a secondary battery.

There has been described in Japanese Patent No. 4,646,284 (Patent Document 1), a technology of providing a bump electrode for source, a bump electrode for drain, and a bump electrode for gate over the same surface of a semiconductor chip formed with trench-type power MOSFETs (Metal Oxide Semiconductor Field Effect Transistors) as shown in FIG. 1 of Patent Document 1.

RELATED ART DOCUMENT

Patent Document

[Patent Document 1] Japanese Patent No. 4,646,284

SUMMARY

For example, as a semiconductor product used in control of a secondary battery, there is known a semiconductor product equipped with a semiconductor chip formed with a first power transistor and a second power transistor reversely coupled in series with the first power transistor. That is, there is known a semiconductor product equipped with a semiconductor chip formed with a first power transistor and a second power transistor, which has a configuration in which a drain of the first power transistor and a drain of the second power transistor are coupled in common.

The semiconductor chip having such a configuration may be used for, for example, an application which causes a charging/discharging current of a secondary battery to flow. This may be called a bidirectional chip size package (bidirectional CSP). In the bidirectional CSP, each of the first power transistor and the second power transistor is formed from, for example, a trench-type power transistor corresponding to a vertical transistor which causes a current to flow in a thickness direction of a semiconductor chip. In this case, in the current bidirectional CSP, a common drain brought into a flowing state is formed at the back surface of the bidirectional CSP, whereas respective source and gate pads of the first power transistor and the second power transistor are formed at the surface of the bidirectional CSP. Then, the bidirectional CSP is mounted over a main surface of a wiring board in a state in which the surface of the bidirectional CSP is opposed to the main surface of the wiring board (face-down mounting).

In this case, since the respective source and gate pads of the first power transistor and the second power transistor formed over the surface of the bidirectional CSP are electrically coupled to the wiring board, the bidirectional CSP and an external circuit element can be electrically coupled. On the other hand, since the back surface of the bidirectional CSP is directed upward, the common drain and the wiring board are not electrically coupled in the current bidirectional CSP, and the common drain is kept in the floating state. Thus, although it is not possible to electrically couple the bidirectional CSP and the external circuit element through the common drain, no problem occurs in particular because the need to electrically couple the bidirectional CSP and the external circuit element through the common drain in the current bidirectional CSP is scarce. The need for electrical coupling to the external circuit element through the common drain of the bidirectional CSP has however recently been increasing according to the specifications of a semiconductor device or the like. It is therefore necessary to examine an improved structure of the bidirectional CSP from the viewpoint of carrying out the electrical coupling to the external circuit element through the common drain in the current bidirectional CSP.

Other problems and novel features will be apparent from the description of the present specification and the accompanying drawings.

In one aspect of the present invention, there is provided a semiconductor chip which is formed at a surface thereof with respective source pads and gate pads of a first power transistor and a second power transistor, and a common drain pad which functions as a drain of the first power transistor and functions even as a drain of the second power transistor.

Also, there is provided a semiconductor device according to another aspect of the present invention, which is equipped with a control unit which controls charging/discharging of a secondary battery, a bidirectional coupling unit which is electrically coupled to the control unit and through which a charging/discharging current flows, and a protection diode coupled between the control unit and the bidirectional coupling unit. At this time, the bidirectional coupling unit has a common drain pad which functions as a drain of a discharging power transistor and functions as a drain of a charging power transistor. Further, an anode of the protection diode is electrically coupled to the common drain pad, and a cathode of the protection diode is electrically coupled to a power supply terminal of the control unit.

Further, there is provided a battery pack according to a further aspect of the present invention, which is equipped with a secondary battery capable of charging and discharging, and the above-described semiconductor device having the function of controlling the secondary battery. The above-described semiconductor device further has a semiconductor chip mounted over a main surface of a wiring board and formed with a bidirectional coupling unit. At this time, respective source pads and gate pads of a discharging power transistor and a charging power transistor, and a common drain pad are formed at the surface of the semiconductor chip. Further, the semiconductor chip is mounted over the wiring board in a state in which the surface of the semiconductor chip is made opposite to the main surface of the wiring board.

According to one aspect of the present invention, there can be provided a semiconductor product high in versatility.

DETAILED DESCRIPTION

Figure 1:
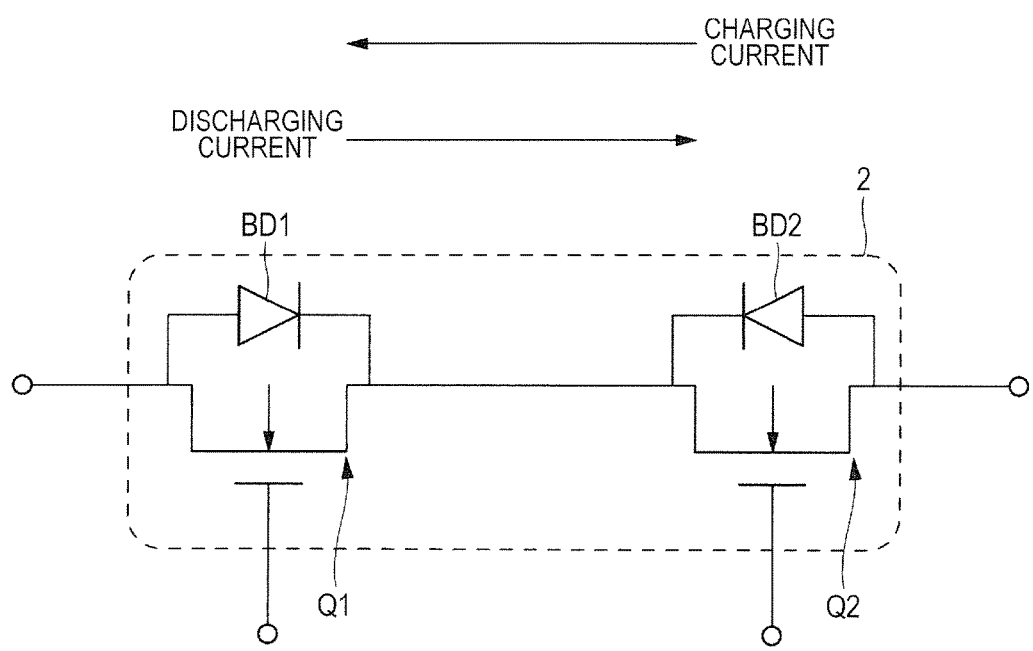
FIG. 1 is a circuit diagram showing a simple circuit configuration of a bidirectional CSP.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc.

It is further needless to say that components (including element or factor steps, etc.) employed in the following embodiments are not always essential except for where otherwise specified in particular and considered to be definitely essential in principle, etc.

Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range. This is similarly applied even to the above-described numerical values and range.

Further, the same reference numerals are respectively attached to the same members in principle in all the drawings for describing the embodiments, and a repeated description thereof will be omitted. Incidentally, even plan diagrams may be hatched for clarity of illustration.

EMBODIMENTS

Usability of Bidirectional CSP

The usability of a bidirectional CSP will first be described. The bidirectional CSP is used for an application of making a current to flow bidirectionally and used as, for example, an electronic component which makes a charging/discharging current to flow.

FIG. 1 is a circuit diagram showing a simple circuit configuration of a bidirectional CSP2. In FIG. 1, the bidirectional CSP2 has, for example, a configuration in which a discharging power transistor Q1 included of an n channel type field effect transistor and a charging power transistor Q2 included of an n channel type field effect transistor are reversely coupled in series. That is, in the bidirectional CSP2, the discharging power transistor Q1 and the charging power transistor Q2 are coupled to each other in such a manner that a drain of the discharging power transistor Q1 and a drain of the charging power transistor Q2 are electrically coupled to each other. In other words, it can also be said that the discharging power transistor Q1 and the charging power transistor Q2 are coupled to each other in such a manner that a cathode of a body diode BD1 parasitically formed in the discharging power transistor Q1 and a cathode of a body diode BD2 parasitically formed in the charging power transistor Q2 are electrically coupled to each other. In the bidirectional CSP2 configured in this way, as shown in FIG. 1, for example, a discharging current can be made to flow from the left side to the right side, and a charging current can be made to flow from the right side to the left side. That is, in the bidirectional CSP2, the discharging current and the charging current which are opposite to each other in direction, can be made to flow.

Now consider, for example, where the bidirectional CSP2 is included of only the discharging power transistor Q1. Even in this case, it is considered that the discharging current and the charging current can be made to flow by bringing the discharging power transistor Q1 into an on state. When, however, the bidirectional CSP2 is included of only the discharging power transistor Q1, the discharging current flows through the body diode BD1 parasitically formed in the discharging power transistor Q1 even when trying to bring the discharging power transistor Q1 into an off state to stop the discharging current. Thus, when the bidirectional CSP2 is included of only the discharging power transistor Q1 in this way, inconvenience occurs in that it is not possible to stop the discharging current. On the other hand, when the bidirectional CSP2 is included of only the charging power transistor Q2, the charging current flows through the body diode BD2 parasitically formed in the charging power transistor Q2 even when trying to bring the charging power transistor Q2 into an off state to stop the charging current. Thus, when the bidirectional CSP2 is included of only the charging power transistor Q2, inconvenience occurs in that it is not possible to stop the charging current.

Therefore, in order to solve the inconvenience described above, in the bidirectional CSP2, as shown in FIG. 1, both of the discharging power transistor Q1 and the charging power transistor Q2 are provided and reversely coupled in series. Consequently, it is possible to carry out control for stopping the discharging current and the charging current. The reason therefor will be described below.

In FIG. 1, the discharging current can be made to flow by bringing the discharging power transistor Q1 into the on state and bringing the charging power transistor Q2 into an on state. Then, upon stopping the discharging current, the discharging power transistor Q1 is brought into the off state and the charging power transistor Q2 is brought into the off state. At this time, even if the discharging power transistor Q1 is brought into the off state, the discharging current flows through the body diode BD1 which parasitically exists in the discharging power transistor Q1. However, the bidirectional CSP2 shown in FIG. 1 has the charging power transistor Q2 reversely coupled in series with the discharging power transistor Q1. The charging power transistor Q2 is placed in the off state, and the body diode BD2 parasitically formed in the charging power transistor Q2 is in a direction opposite to the direction in which the discharging current flows. Therefore, the flow of the discharging current is blocked by the body diode BD2. From this, the bidirectional CSP2 shown in FIG. 1 can control the discharging current so as not to flow.

Likewise, in FIG. 1, the charging current can be made to flow by bringing the discharging power transistor Q1 into the on state and bringing the charging power transistor Q2 into the on state. Then, upon stopping the charging current, the discharging power transistor Q1 is brought into the off state and the charging power transistor Q2 is brought into the off state. At this time, even if the charging power transistor Q2 is brought into the off state, the charging current flows through the body diode BD2 which parasitically exists in the charging power transistor Q2. However, the bidirectional CSP2 shown in FIG. 1 has the discharging power transistor Q1 reversely coupled in series with the charging power transistor Q2. Since the discharging power transistor Q1 is placed in the off state, and the body diode BD1 parasitically formed in the discharging power transistor Q1 is in a direction opposite to the direction in which the charging current flows, the flow of the charging current is blocked by the body diode BD1. From this, the bidirectional CSP2 shown in FIG. 1 is capable of controlling the charging current so as not to flow.

From the above, as shown in FIG. 1, the on/off control of the discharging current and the charging current can be performed by configuring the bidirectional CSP2 from the discharging power transistor Q1 and the charging power transistor Q2 reversely coupled in series. That is, the bidirectional CSP2 shown in FIG. 1 enables the on/off control of the discharging current and the charging current. In this point, the usability of the bidirectional CSP2 shown in FIG. 1 exists.

DESCRIPTION OF RELATED ART

A related art related to a battery pack using a bidirectional CSP will next be described. Thereafter, improvements in the related art will be examined. A description will further be made about a technical idea estimated by the examination of the improvements in the related art. Incidentally, the "related art" descried in the present specification is a technology having problems newly found by the inventors, but is not a known related art. This related art is however a technology described as being intended to be a technology (unknown technology) premised on a novel technical idea.

Figure 2:
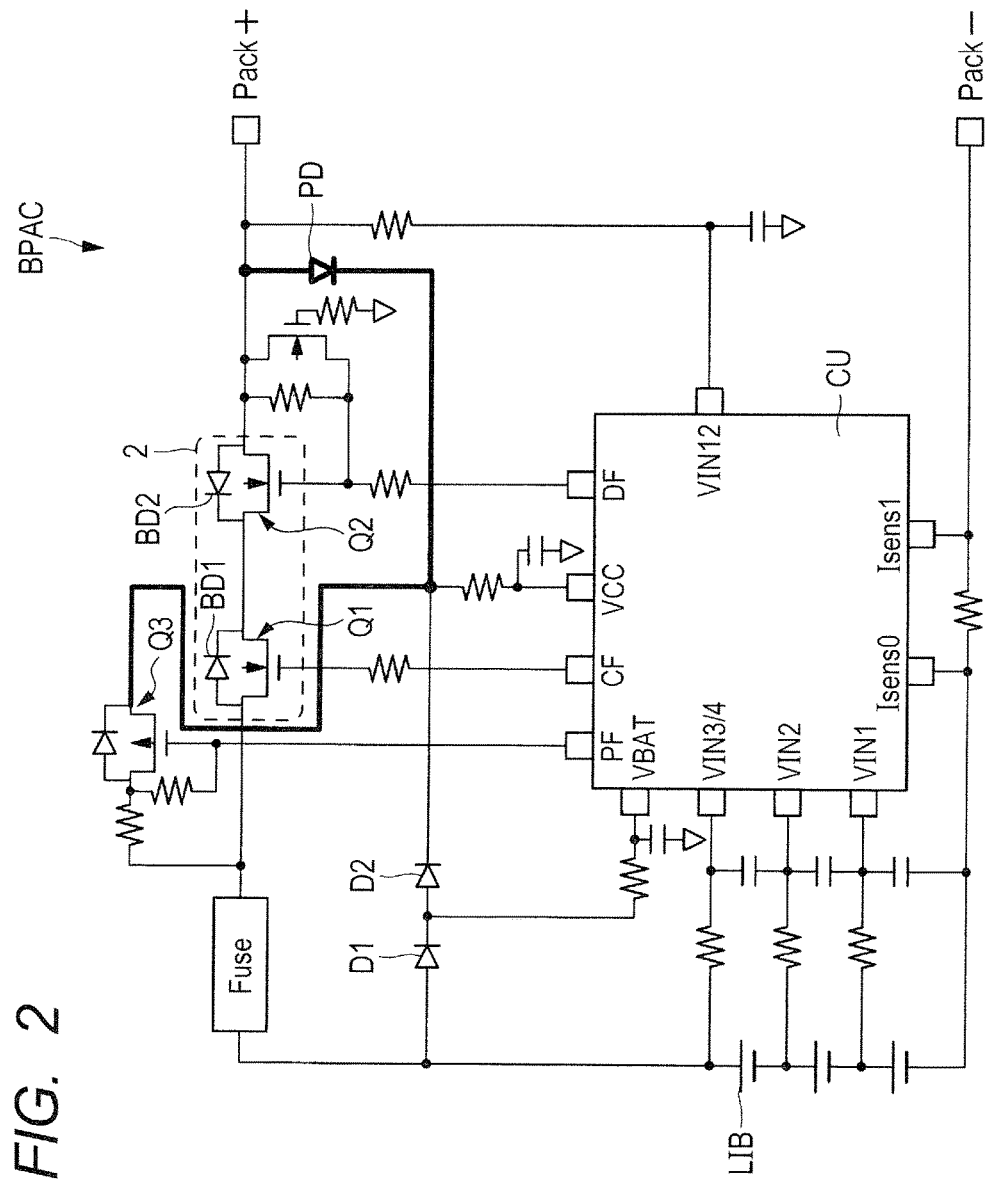
FIG. 2 is a circuit diagram showing a circuit configuration of a battery pack in a related art.

FIG. 2 is a circuit diagram showing a circuit configuration of a battery pack BPAC in a related art. In FIG. 2, the battery pack BPAC in the related art is provided with a lithium ion battery LIB being one example of a secondary battery capable of charging and discharging, between a positive terminal Pack+ and a negative terminal Pack− of the battery pack BPAC. The lithium ion battery LIB is electrically coupled to a control unit CU which controls charging and discharging of the lithium ion battery LIB. Specifically, the control unit CU is included of, for example, a control IC. The lithium ion battery LIB and input terminals (terminals VIN1, VIN2 and VIN3/4) of the control unit CU are electrically coupled. Further, terminals (Isens0 and Isens1) of the control unit CU are electrically coupled to the negative terminal Pack− of the battery pack BPAC.

Next, in the related art, the lithium ion battery LIB and the bidirectional CSP2 are electrically coupled through a fuse (Fuse). Further, the bidirectional CSP2 is electrically coupled to the positive terminal Pack+ of the battery pack BPAC. Then, the bidirectional CSP2 is included of a discharging power transistor Q1 and a charging power transistor Q2 reversely coupled in series with each other. A body diode BD1 is parasitically formed in the discharging power transistor Q1. Likewise, a body diode BD2 is parasitically formed even in the charging power transistor Q2.

Here, the bidirectional CSP2 and the control unit CU are electrically coupled to each other. Specifically, a gate of the discharging power transistor Q1 and a terminal CF of the control unit CU are electrically coupled to each other, and a gate of the charging power transistor Q2 and a terminal DF of the control unit CU are electrically coupled to each other. Thus, the turning on/off of a charging/discharging current flowing through the bidirectional CSP2 is controlled by the control unit CU.

Subsequently, a power supply terminal VCC of the control unit CU is electrically coupled to the lithium ion battery LIB through diodes D1 and D2 coupled in series. Also, a coupling node between the diodes D1 and D2 and a terminal VBAT of the control unit CU are electrically coupled to each other.

Further, in the related art, the positive terminal Pack+ of the battery pack BPAC and a terminal VIN12 of the control unit CU are electrically coupled to each other, and a protection diode PD is coupled between the positive terminal Pack+ of the battery back BPAC and the power supply terminal VCC of the control unit CU. Specifically, in the protection diode PD, an anode thereof is coupled to the positive terminal Pack+ of the battery pack BPAC, and a cathode thereof is coupled to the power supply terminal VCC of the control unit CU. Further, a normally-on power transistor Q3 included of a p channel type field effect transistor is electrically coupled to the power supply terminal VCC of the control unit CU. The normally-on power transistor Q3 is coupled to a coupling node between the fuse (Fuse) and the bidirectional CSP2. Then, a gate of the normally-on power transistor Q3 is electrically coupled to a terminal PF of the control unit CU.

The battery pack BPAC in the related art is circuit-configured in the above-described manner. A main circuit operation of the battery pack BPAC in the related art will be described below. A basic operation for charging/discharging will first be described in FIG. 2.

A description will be made about the operation of coupling a load between the positive and negative terminals Pack+ and Pack− of the battery pack BPAC to allow a discharging current to flow from the lithium ion battery LIB. In FIG. 2, a gate voltage greater than or equal to a threshold voltage of the discharging power transistor Q1 is applied from the terminal CF of the control unit CU to the gate of the discharging power transistor Q1. Further, a gate voltage greater than or equal to a threshold voltage of the charging power transistor Q2 is applied from the terminal DF of the control unit CU to the gate of the charging power transistor Q2. Thus, the discharging power transistor Q1 and the charging power transistor Q2 which configure the bidirectional CSP2 are respectively brought into an on state. As a result, a discharging current flows from the lithium ion battery LIB to the positive terminal Pack+ of the battery pack BPAC through the fuse and the bidirectional CSP2. On the other hand, when the discharging current is stopped, a gate voltage less than the threshold voltage is applied from the terminal CF of the control unit CU to the gate of the discharging power transistor Q1, and a gate voltage less than the threshold voltage is applied from the terminal DF of the control unit CU to the gate of the charging power transistor Q2. Thus, the discharging power transistor Q1 and the charging power transistor Q2 which configure the bidirectional CSP2 are respectively brought into an off state. As a result, the discharging current from the lithium ion battery LIB is cut off in the bidirectional CSP2.

Next, a description will be made about the operation of coupling a charger between the positive and negative terminals Pack+ and Pack− of the battery pack BPAC to allow a charging current to flow into the lithium ion battery LIB. In FIG. 2, a gate voltage greater than or equal to the threshold voltage is applied from the terminal CF of the control unit CU to the gate of the discharging power transistor Q1. Further, a gate voltage greater than or equal to the threshold voltage is applied from the terminal DF of the control unit CU to the gate of the charging power transistor Q2. Thus, the discharging power transistor Q1 and the charging power transistor Q2 which configure the bidirectional CSP2 are respectively brought into an on state. As a result, a charging current flows from the positive terminal Pack+ of the battery pack BPAC coupled to the charger to the lithium ion battery LIB through the bidirectional CSP2 and the fuse. On the other hand, when the charging current is stopped, a gate voltage less than the threshold voltage is applied from the terminal CF of the control unit CU to the gate of the discharging power transistor Q1, and a gate voltage less than the threshold voltage is applied from the terminal DF of the control unit CU to the gate of the charging power transistor Q2. Thus, the discharging power transistor Q1 and the charging power transistor Q2 which configure the bidirectional CSP2 are respectively brought into an off state. As a result, the charging current from the charger is cut off in the bidirectional CSP2.

Figure 3:
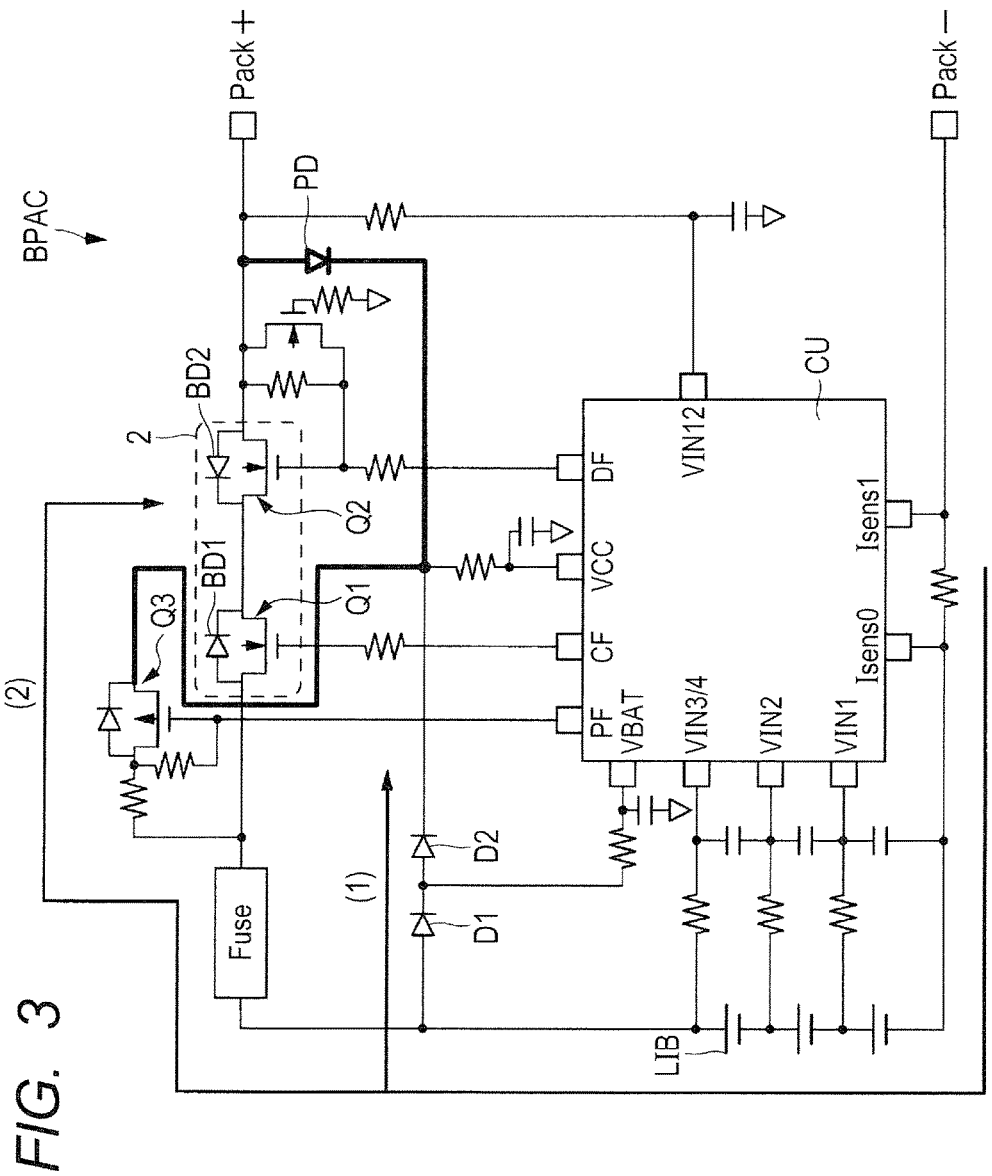
FIG. 3 is a diagram for describing power supply paths from a lithium ion battery at a normal operation to a control unit in the related art.

Subsequently, a description will be made about power supply paths from the lithium ion battery LIB to the control unit CU at the normal operation of the lithium ion battery LIB. FIG. 3 is a diagram for describing the power supply paths from the lithium ion battery LIB at the normal operation to the control unit CU in the related art. In FIG. 3, in the related art, there are paths shown below as the power supply paths from the lithium ion battery LIB at the normal operation to the control unit CU. That is, it is understood that a path (1) reaching the power supply terminal VCC of the control unit CU from the lithium ion battery LIB via the diode D1 and the diode D2, and a path (2) reaching the power supply terminal VCC of the control unit CU from the lithium ion battery LIB via the fuse and the normally-on power transistor Q3 exist in the related art.

Figure 4:
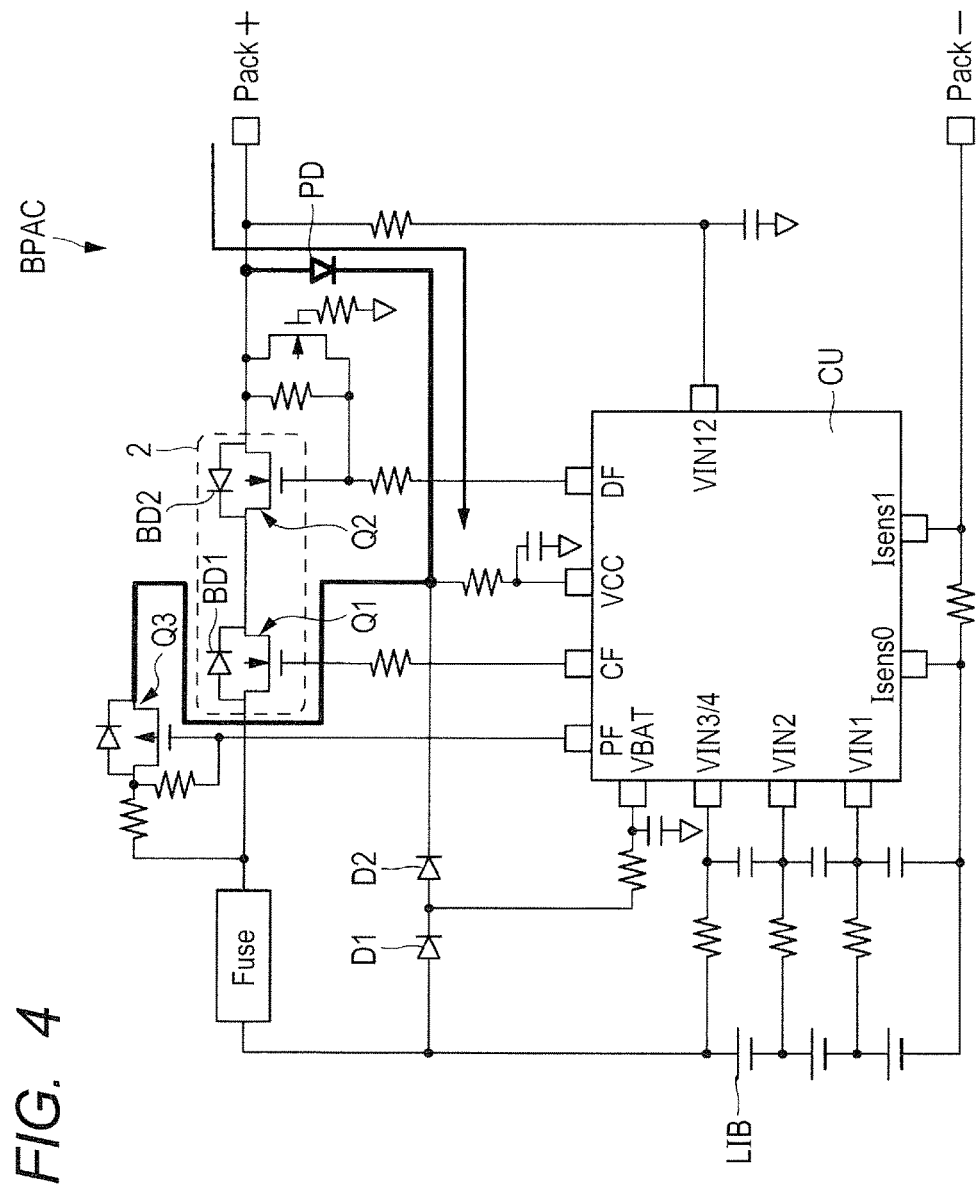
FIG. 4 is a diagram for describing a power supply path from a charger at the time of precharge to the control unit in the related art.

Next, a description will be made about a power supply path from the charger to the control unit CU when the lithium ion battery LIB is empty (at the time of precharge). FIG. 4 is a diagram for describing a power supply path from the charger at the precharge time to the control unit CU in the related art. It is understood that in FIG. 4, a path reaching the power supply terminal VCC of the control unit CU from the positive terminal Pack+ of the battery pack BPAC via the protection diode PD exists as the power supply path from the charger at the time of precharge to the control unit CU.

Figure 5:
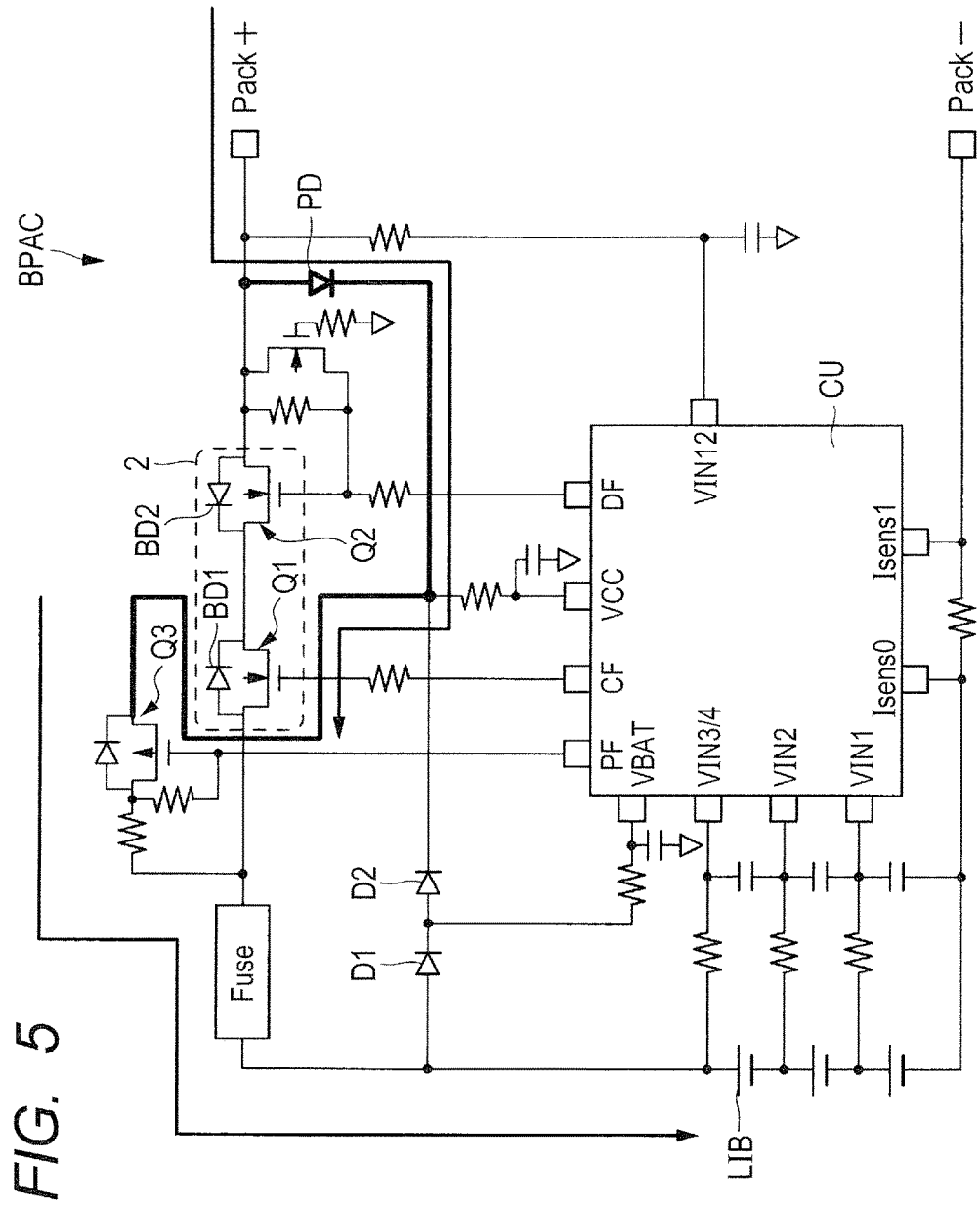
FIG. 5 is a diagram for describing a current path through which a precharge current flows from the charger at the time of precharge to the lithium ion battery in the related art.

Subsequently, a description will be made about a current path for a charging current at the time of precharge. FIG. 5 is a diagram for describing a current path through which a precharge current flows from the charger at the time of precharge to the lithium ion battery LIB in the related art. First, in FIG. 5, as the current path through which the precharge current flows, there is considered a path through which the precharge current flows from the positive terminal Pack+ of the battery pack BPAC to the lithium ion battery LIB through the bidirectional CSP2 and the fuse. When, however, the lithium ion battery LIB is empty (at the time of precharge), especially in an overdischarged state (in a state when the battery voltage substantially drops), the operating voltage of the control unit CU is not sufficiently obtained. As a result, it is not possible to perform control of the bidirectional CSP2 by the control unit CU. That is, it is not possible to bring the discharging power transistor Q1 and the charging power transistor Q2 into the on state by applying the gate voltage greater than or equal to the threshold voltage from the terminal CF of the control unit CU to the gate of the discharging power transistor Q1 and applying the gate voltage greater than or equal to the threshold voltage from the terminal DF of the control unit CU to the gate of the charging power transistor Q2.

Therefore, in the related art, as shown in FIG. 5, the path through which the precharge current is made to flow from the positive terminal Pack+ of the battery pack BPAC to the lithium ion battery LIB via the protection diode PD and the normally-on power transistor Q3 is provided as the current path through which the precharge current flows. This path makes it possible to ensure the current path through which the precharge current flows, by the normally-on power transistor Q3 operated at a gate voltage of 0V even when the operating voltage of the control unit CU is not sufficiently obtained in the overdischarged state.

Figure 6:
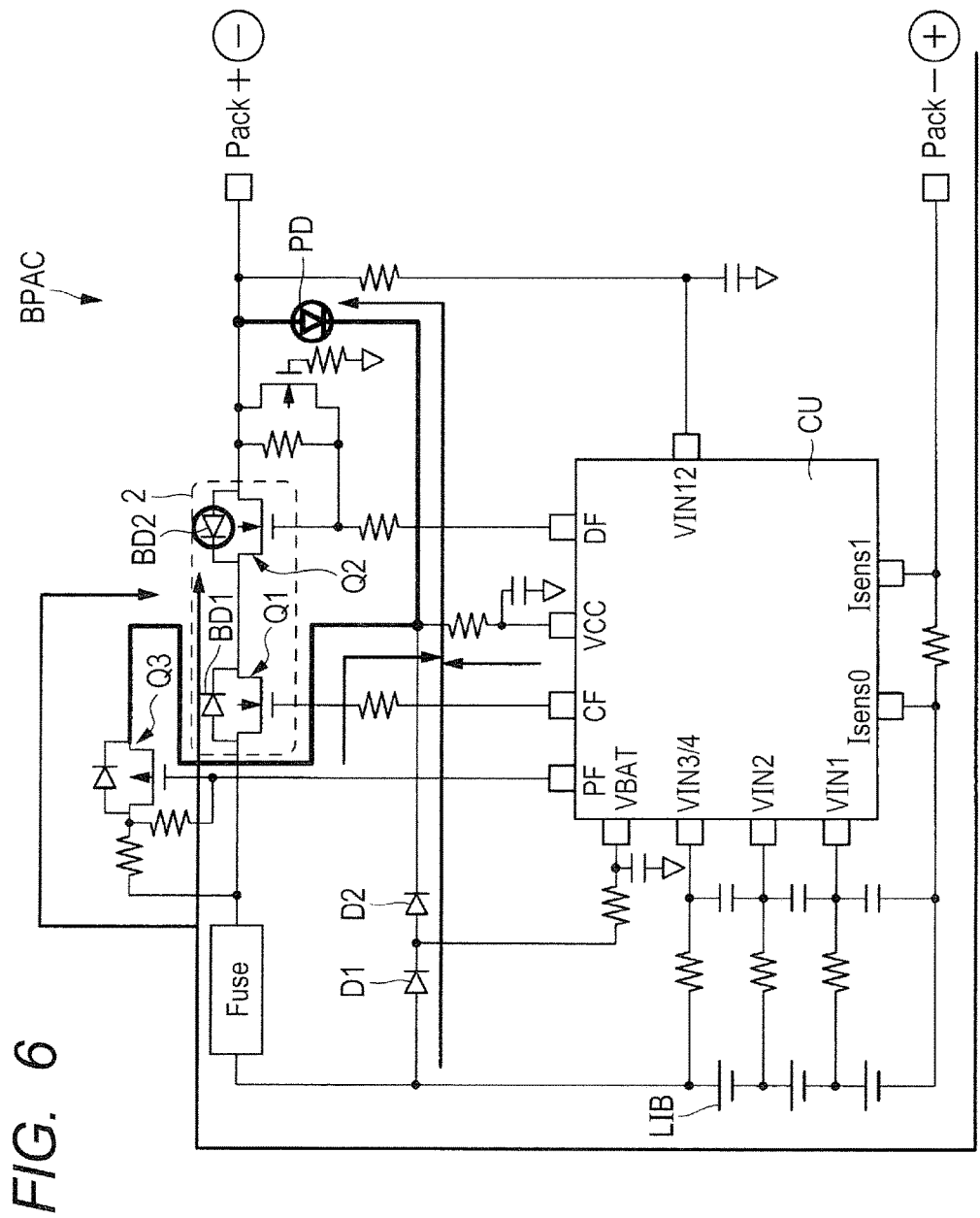
FIG. 6 is a diagram for describing paths for cutting off reverse charging currents in the related art.

Next, a description will be made about the function of cutting off a reverse charging current at the time that the battery pack BPAC is erroneously reverse-charged in the related art (at the time of abnormalities). FIG. 6 is a diagram for describing paths for cutting off reverse charging currents in the related art. In FIG. 6, first, upon reverse charging, a negative potential is applied to the positive terminal Pack+ of the battery pack BPAC, and a positive potential is applied to the negative terminal Pack- of the battery pack BPAC. In this case, as shown FIG. 6, the reverse charging current which flows from the lithium ion battery LIB to the bidirectional CSP2 through the fuse is cut off by the body diode BD2 parasitically formed in the charging power transistor Q2 in the bidirectional CSP2. On the other hand, in the related art, a reverse charging current which flows from the lithium ion battery LIB to the positive terminal Pack+ of the battery pack BPAC via the diode D1 and the diode D2 exists as the reverse charging current as shown in FIG. 6. Further, in the related art, as reverse charging currents, a reverse charging current which flows to the positive terminal Pack+ of the battery pack BPAC via the normally-on power transistor Q3, and a reverse charging current which flows from the power supply terminal VCC of the control unit CU to the positive terminal Pack+ of the battery pack BPAC also exist. These reverse charging currents are cut off by the protection diode PD as shown in FIG. 6. It is understood from the above that in the related art, the function of cutting off the reverse charging currents is realized by the body diode BD2 in the bidirectional CSP2 and the protection diode PD.

<Examination of Improvements>

In the related art as described above, the function of cutting off the reverse charging currents has been realized by the body diode BD2 in the bidirectional CSP2 and the protection diode PD. The reverse charging currents from the paths (three systems) different from each other flow into the protection diode PD. The protection diode PD cuts off these reverse charging currents. Therefore, there is a risk that a burden on the cutting-off function of the protection diode PD will increase and hence the protection diode PD will be broken depending on the state at the time of reverse charging. In this case, the function of cutting off the reverse charging currents is not exerted, thus resulting in the concern that the battery pack BPAC will break down. That is, although the function of cutting off the reverse charging currents is provided at any case in the related art, the necessity of improvements exists in terms of achieving a further improvement in the reliability of the battery pack BPAC.

Thus, the present embodiment has been devised to improve further reliability of the battery pack BPAC. A description will hereinafter be made about the technical idea in the present embodiment devised in this way.

<Circuit Configuration of Battery Pack in the Embodiment>

Figure 7:
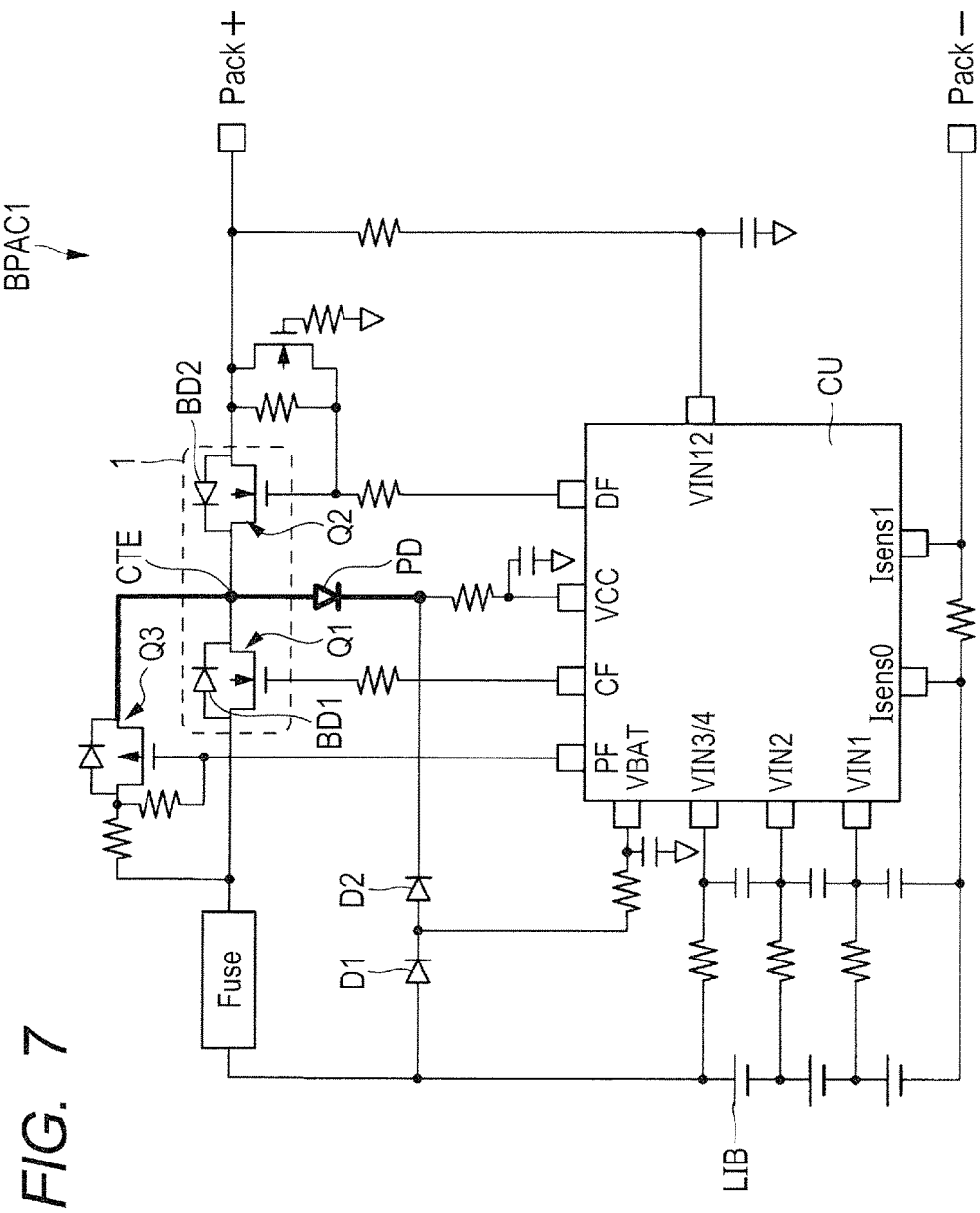
FIG. 7 is a circuit diagram showing a circuit configuration of a battery pack in an embodiment.

FIG. 7 is a circuit diagram showing a circuit configuration of a battery pack BPAC1 in the present embodiment. In FIG. 7, the battery pack BPAC1 in the present embodiment is provided with a lithium ion battery LIB being one example of a secondary battery capable of charging and discharging between a positive terminal Pack+ and a negative terminal Pack- of the battery pack BPAC1. The lithium ion battery LIB is electrically coupled to a control unit CU which controls charging and discharging of the lithium ion battery LIB. Specifically, the control unit CU is included of, for example, a control IC. The lithium ion battery LIB and input terminals (terminals VIN1, VIN2 and VIN3/4) of the control unit CU are electrically coupled. Further, terminals (Isens0 and Isens1) of the control unit CU are electrically coupled to the negative terminal Pack- of the battery pack BPAC1.

Next, in the battery pack BPAC1 in the present embodiment, the lithium ion battery LIB and a bidirectional CSP1 are electrically coupled through a fuse (Fuse). Further, the bidirectional CSP1 is electrically coupled to the positive terminal Pack+ of the battery pack BPAC1. Then, the bidirectional CSP1 is included of a discharging power transistor Q1 and a charging power transistor Q2 reversely coupled in series with each other. A body diode BD1 is parasitically formed in the discharging power transistor Q1. Likewise, a body diode BD2 is parasitically formed even in the charging power transistor Q2.

Here, the bidirectional CSP1 and the control unit CU are electrically coupled to each other. Specifically, a gate of the discharging power transistor Q1 and a terminal CF of the control unit CU are electrically coupled to each other, and a gate of the charging power transistor Q2 and a terminal DF of the control unit CU are electrically coupled to each other. Thus, the turning on/off of a charging/discharging current flowing through the bidirectional CSP1 is controlled by the control unit CU.

Subsequently, a power supply terminal VCC of the control unit CU is electrically coupled to the lithium ion battery LIB through diodes D1 and D2 coupled in series. Also, a coupling node between the diodes D1 and D2 and a terminal VBAT of the control unit CU are electrically coupled to each other. Further, in the present embodiment, the positive terminal Pack+ of the battery pack BPAC1 and the terminal VIN12 of the control unit CU are electrically coupled to each other.

Next, in the battery pack BPAC1 in the present embodiment, as shown in FIG. 7, a protection diode PD is coupled between a coupling node between the discharging power transistor Q1 and the charging power transistor Q2 which configure the bidirectional CSP1, and the power supply terminal VCC of the control unit CU. That is, the protection diode PD is coupled between a common drain terminal CTE between the discharging power transistor Q1 and the charging power transistor Q2 and the power supply terminal VCC of the control unit CU. Specifically, in the protection diode PD, an anode thereof is coupled to the common drain terminal CTE, and a cathode thereof is coupled to the power supply terminal VCC of the control unit CU. Further, the body diode BD1 is formed in the discharging power transistor Q1. A cathode of the body diode BD1 is electrically coupled to the common drain terminal CTE. Likewise, the body diode BD2 is formed in the charging power transistor Q2. A cathode of the body diode BD2 is electrically coupled to the common drain terminal CTE.

Further, a normally-on power transistor Q3 included of a p channel type field effect transistor is electrically coupled to the common drain terminal CTE of the bidirectional CSP1. The normally-on power transistor Q3 is coupled to a coupling node between the fuse (Fuse) and the bidirectional CSP1. That is, the normally-on power transistor Q3 is coupled in parallel with the discharging power transistor Q1 and electrically coupled to the common drain terminal CTE.

Thus, the battery pack BPAC1 in the present embodiment is equipped with the lithium ion battery LIB (secondary battery) capable of charging and discharging, and a semiconductor device which controls the lithium ion battery LIB. Here, the semiconductor device is equipped with the control unit CU which controls the charging/discharging of the secondary battery, the bidirectional CSP1 (bidirectional coupling unit) which is electrically coupled to the control unit CU and through which the charging/discharging current flows, and the protection diode PD coupled between the control unit CU and the bidirectional CSP1. And the bidirectional CSP1 has the discharging power transistor Q1, the charging power transistor Q2 reversely coupled in series with the discharging power transistor Q1, and the common drain terminal CTE which functions as a drain of the discharging power transistor Q1 and functions as a drain of the charging power transistor Q2. At this time, the anode of the protection diode PD is electrically coupled to the common drain terminal CTE, and the cathode of the protection diode PD is electrically coupled to the power supply terminal VCC of the control unit CU.

The battery pack BPAC1 in the present embodiment is circuit-configured in the above-described manner. A main circuit operation of the battery pack BPAC1 in the present embodiment will be described below. First, since a basic operation for charging/discharging in the present embodiment is similar to the basic operation for charging/discharging in the related art, the description thereof will be omitted.

Figure 8:
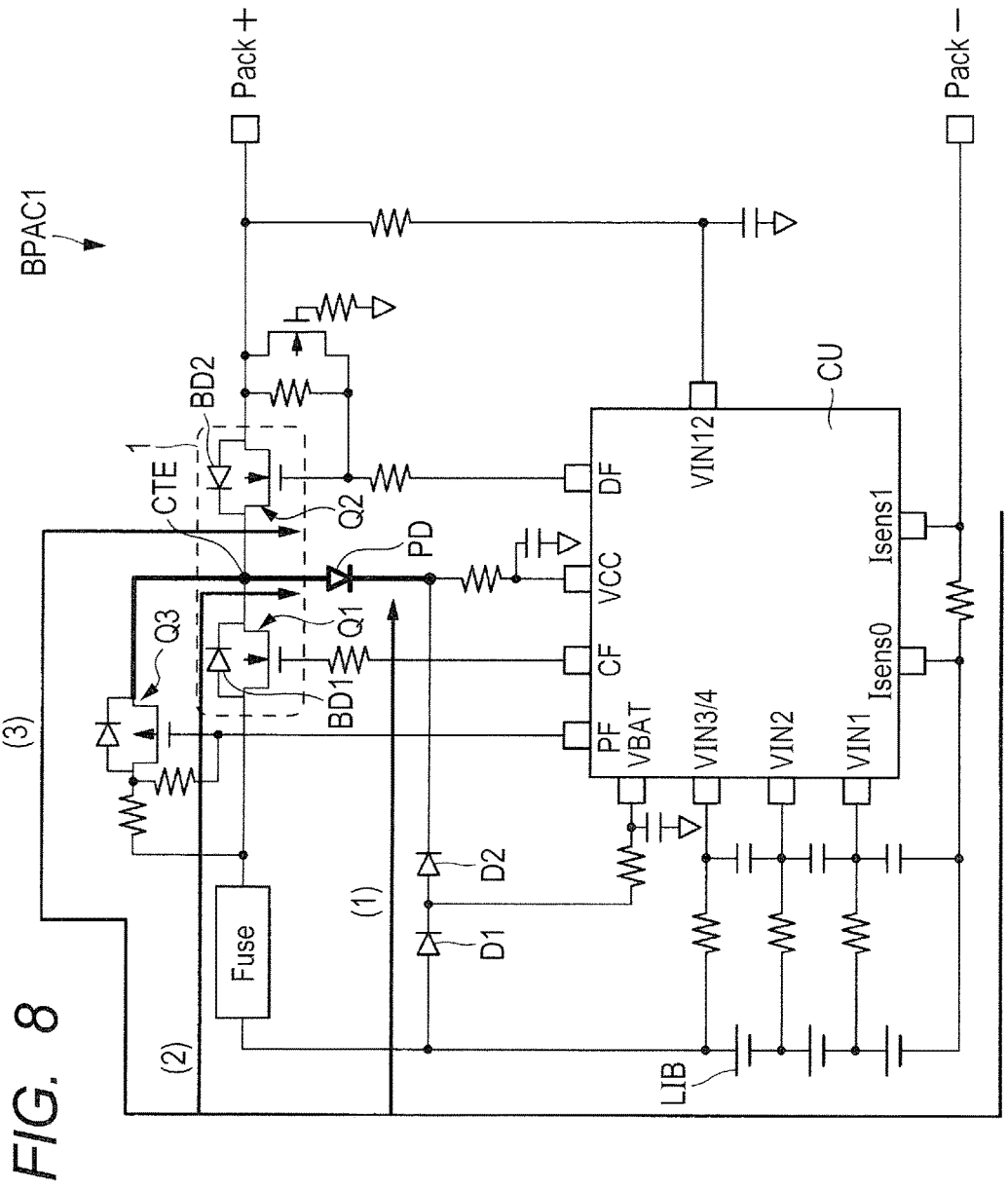
FIG. 8 is a diagram for describing power supply paths from a lithium ion battery at a normal operation to a control unit in the embodiment.

Subsequently, a description will be made about power supply paths from the lithium ion battery LIB to the control unit CU at the normal operation of the lithium ion battery LIB. FIG. 8 is a diagram for describing the power supply paths from the lithium ion battery LIB at the normal operation to the control unit CU in the present embodiment. It is understood that in FIG. 8, in the present embodiment, a path (1) reaching the power supply terminal VCC of the control unit CU from the lithium ion battery LIB via the diodes D1 and D2 exist as the power supply path from the lithium ion battery LIB at the normal operation to the control unit CU. Also, in the present embodiment, it is understood that a path (2) reaching the power supply terminal VCC of the control unit CU from the lithium ion battery LIB via the discharging power transistor Q1→the common drain terminal CTE→the protection diode PD exists as the power supply path from the lithium ion battery LIB at the normal operation to the control unit CU. Further, in the present embodiment, it is understood that a path (3) reaching the power supply terminal VCC of the control unit CU from the lithium ion battery LIB via the normally-on power transistor Q3→the common drain terminal CTE→the protection diode PD exists as the power supply path from the lithium ion battery LIB at the normal operation to the control unit CU.

Figure 9:
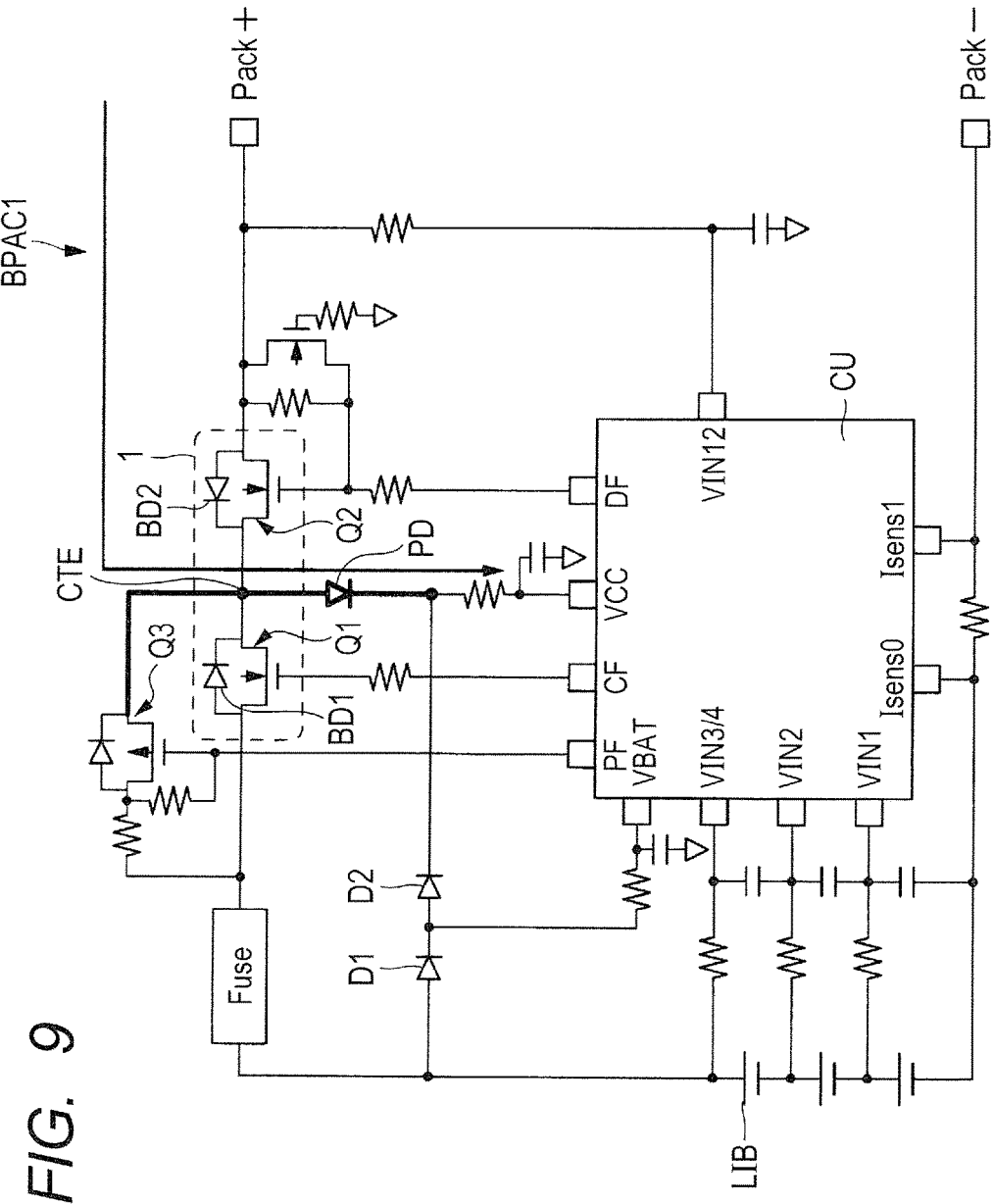
FIG. 9 is a diagram for describing a power supply path from a charger at the time of precharge to the control unit in the embodiment.

Next, a description will be made about a power supply path from the charger to the control unit CU when the lithium ion battery LIB is empty (at the time of precharge). FIG. 9 is a diagram for describing a power supply path from the charger at the precharge time to the control unit CU in the present embodiment. It is understood that in FIG. 9, a path reaching the power supply terminal VCC of the control unit CU from the positive terminal Pack+ of the battery pack BPAC1 via the charging power transistor Q2→the common drain terminal CTE→the protection diode PD exists as the power supply path from the charger at the time of precharge to the control unit CU in the present embodiment.

Figure 10:
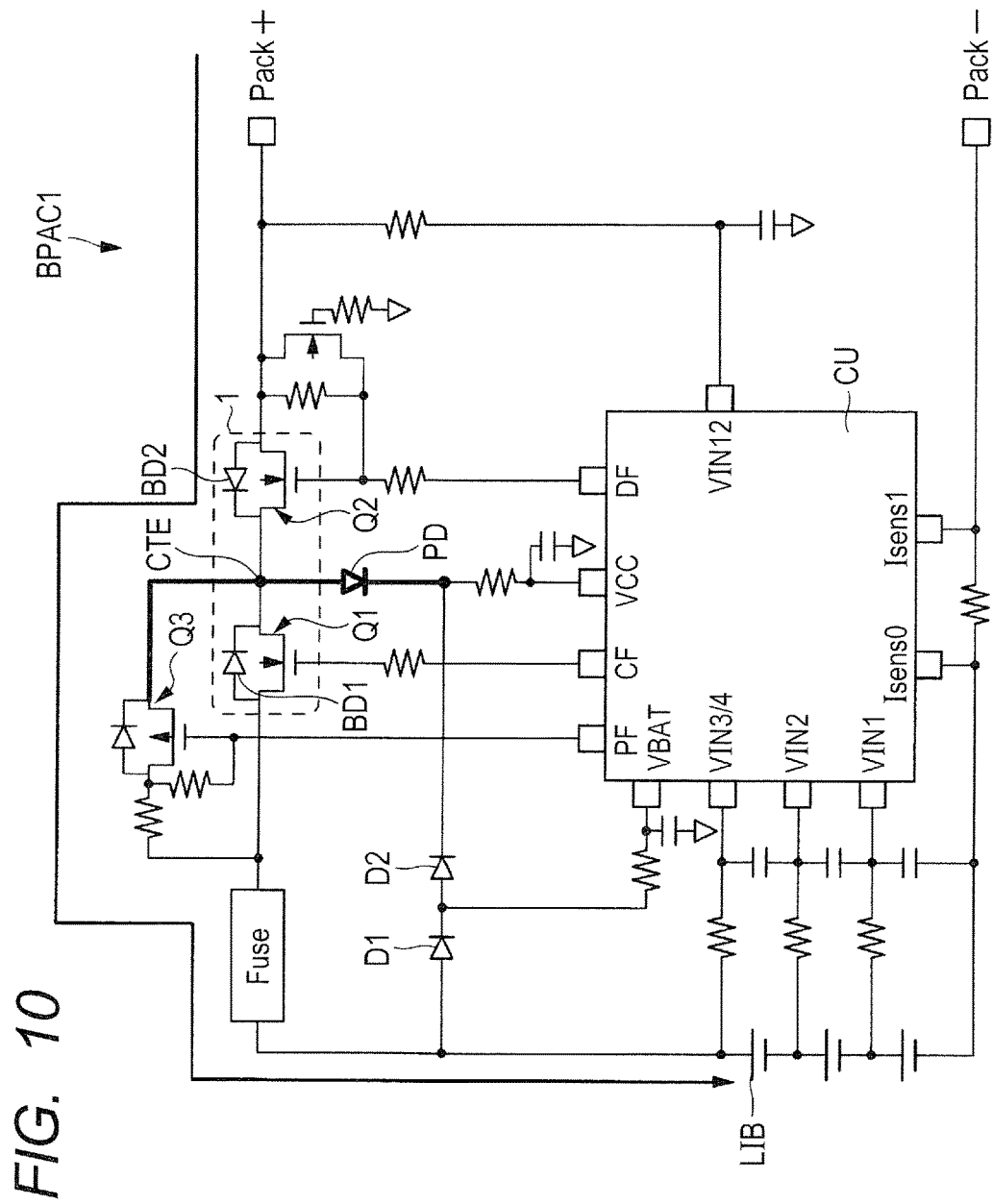
FIG. 10 is a diagram for describing a current path through which a precharge current flows from the charger at the time of precharge to the lithium ion battery in the embodiment.

Subsequently, a description will be made about a current path for a charging current at the time of precharge. FIG. 10 is a diagram for describing a current path through which a precharge current flows from the charger at the time of precharge to the lithium ion battery LIB in the present embodiment. First, in FIG. 10, as the current path through which the precharge current flows, there is considered a path through which the precharge current flows from the positive terminal Pack+ of the battery pack BPAC1 to the lithium ion battery LIB through the bidirectional CSP1 and the fuse. When, however, the lithium ion battery LIB is empty (at the time of precharge), especially in an overdischarged state (in a state when the battery voltage substantially drops), the operating voltage of the control unit CU is not sufficiently obtained. As a result, it is not possible to perform control of the bidirectional CSP1 by the control unit CU. That is, it is not possible to bring the discharging power transistor Q1 and the charging power transistor Q2 into an on state by applying a gate voltage greater than or equal to a threshold voltage of the discharging power transistor Q1 from the terminal CF of the control unit CU to the gate of the discharging power transistor Q1 and applying a gate voltage greater than or equal to a threshold voltage of the charging power transistor Q2 from the terminal DF of the control unit CU to the gate of the charging power transistor Q2.

Therefore, in the present embodiment, as shown in FIG. 10, the path through which the precharge current is made to flow from the positive terminal Pack+ of the battery pack BPAC1 to the lithium ion battery LIB via the body diode BD2→the common drain terminal CTE→the normally-on power transistor Q3 is provided as the current path through which the precharge current flows. This path makes it possible to ensure the current path through which the precharge current flows, by the normally-on power transistor Q3 operated at a gate voltage of 0V even when the operating voltage of the control unit CU is not sufficiently obtained in the overdischarged state.

Figure 11:
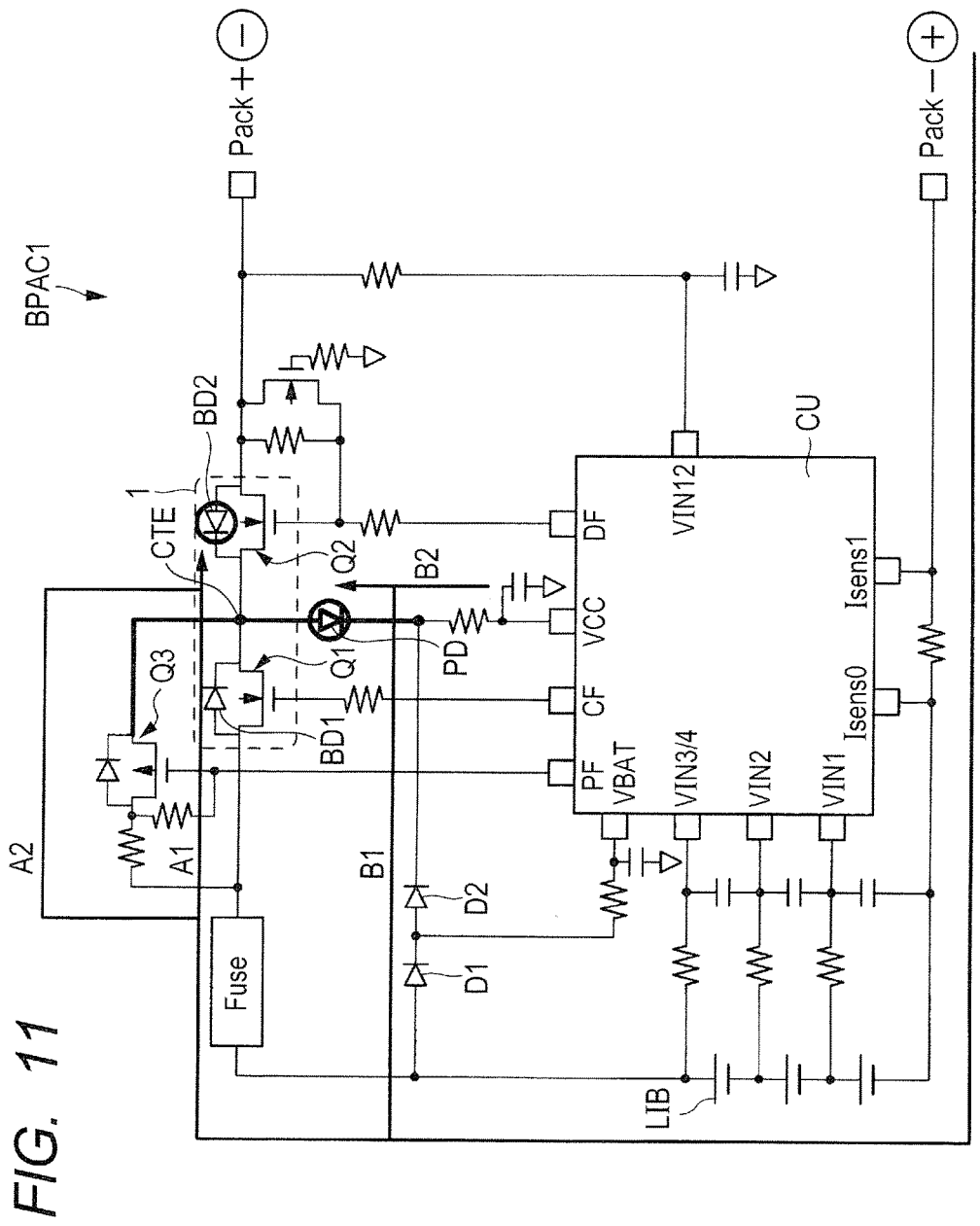
FIG. 11 is a diagram for describing paths for cutting off a reverse charging current in the embodiment.

Next, a description will be made about the function of cutting off each reverse charging current at the time that the battery pack BPAC1 is erroneously reverse-charged in the present embodiment (at the time of abnormalities). FIG. 11 is a diagram for describing paths for cutting off the reverse charging currents in the present embodiment. In FIG. 11, first, upon reverse charging, a negative potential is applied to the positive terminal Pack+ of the battery pack BPAC1, and a positive potential is applied to the negative terminal Pack− of the battery pack BPAC1. In this case, as shown FIG. 11, a reverse charging current A1 which flows from the lithium ion battery LIB to the positive terminal Pack+ via the bidirectional CSP1 is cut off by the body diode BD2 parasitically formed in the charging power transistor Q2 in the bidirectional CSP1. Likewise, a reverse charging current A2 which flows from the lithium ion battery LIB to the positive terminal Pack+ via the normally-on power transistor Q3→the common drain terminal CTE is also cut off by the body diode BD2 parasitically formed in the charging power transistor Q2 in the bidirectional CSP1.

On the other hand, in the present embodiment, a reverse charging current B1 which flows from the lithium ion battery LIB to the positive terminal Pack+ of the battery pack BPAC1 via the diode D1 and the diode D2 exists as the reverse charging current as shown in FIG. 11. Further, in the present embodiment, as the reverse charging current, a reverse charging current B2 which flows from the power supply terminal VCC of the control unit CU to the positive terminal Pack+ of the battery pack BPAC1 also exists. These reverse charging currents (B1+B2) are cut off by the protection diode PD as shown in FIG. 11. It is understood from the above that in the present embodiment, the function of cutting off the reverse charging currents is realized by the body diode BD2 in the bidirectional CSP1 and the protection diode PD.

<Features on Circuit in the Embodiment>

Here, a feature point on the circuit in the present embodiment resides in that the protection diode PD is coupled between the common drain terminal CTE of the bidirectional CSP1 and the power supply terminal VCC of the control unit CU. Thus, according to the present embodiment, the reverse charging currents (B1+B2) can be cut off by both of the protection diode PD and the body diode BD2. That is, according to the feature point on the circuit in the present embodiment, the function of cutting off the reverse charging currents (B1+B2) can be made dual.

For example, as shown in FIG. 11, in the battery pack BPAC1 in the present embodiment, the reverse charging currents (B1+B2) which flow at the time of reverse charging are first cut off by the protection diode PD coupled between the common drain terminal CTE of the bidirectional CSP1 and the power supply terminal VCC of the control unit CU. At this time, even when the protection diode PD is broken for some reason, the reverse charging currents (B1+B2) are cut off by the body diode BD2 parasitically formed in the charging power transistor Q2 in the bidirectional CSP1. As a result, according to the battery pack BPAC1 in the present embodiment, the function of cutting off the reverse charging currents (B1+B2) in dual form can be realized by such a configuration that the protection diode PD is provided between the common drain terminal CTE of the bidirectional CSP1 and the power supply terminal VCC of the control unit CU. Thus, according to the present embodiment, it is possible to achieve an improvement in the reliability of the battery pack BPAC1 in that the function of cutting off the reverse charging currents (B1+B2) in dual form is realized.

<Necessity of Improvements in Bidirectional CSP>

As described above, the battery pack BPAC1 in the present embodiment has the feature point on the circuit that the protection diode PD is coupled between the common drain terminal CTE of the bidirectional CSP1 and the power supply terminal VCC of the control unit CU as shown in FIG. 11, for example. In order to embody the feature point on the circuit, there is a need to improve the configuration of the bidirectional CSP1. This point will be described below.

For example, in the related art, as shown in FIG. 2, the common drain of the bidirectional CSP2 is not electrically coupled to external circuit elements. This means that in the related art, the need for providing the common drain terminal in the bidirectional CSP2 and electrically coupling the same to each external circuit element is scarce. From this point, it is natural that as a layout configuration of the bidirectional CSP2 in the related art, there is adopted a layout configuration that on the assumption that a trench power MOSFET corresponding to a vertical transistor is used, a common drain electrode is formed at the back surface of the bidirectional CSP2, and respective source and gate pads of the discharging power transistor Q1 and the charging power transistor Q2 are provided at the front surface thereof. The bidirectional CSP2 layout-configured in this way is mounted over a wiring board by face-down mounting. Since, in this case, the respective source and gate pads of the discharging power transistor Q1 and the charging power transistor Q2 are electrically coupled to wirings of the wiring board, they can be electrically coupled to the external circuit elements mounted over the wiring board. On the other hand, the common drain electrode facing the upper side is not electrically coupled to the wiring board and brought into a floating state.

In the layout configuration of the bidirectional CSP2, however, the circuit for the battery pack BPAC in the related art can be realized. On the other hand, it becomes difficult to realize the circuit for the battery pack BPAC1 in the present embodiment. This is because the layout configuration of the bidirectional CSP2 for realizing the circuit in the related art is not intended to be a layout configuration having assumed that the common drain electrode is electrically coupled to the external circuit elements. That is, in order to realize the circuit in the present embodiment, there is a need to realize the layout configuration in which the common drain terminal capable of being coupled to its corresponding external circuit element is provided in the bidirectional CSP2, and the common drain terminal and the external circuit element are electrically coupled to each other.

Therefore, the present embodiment has been devised to realize the layout configuration in which the bidirectional CSP1 is provided at the surface thereof not only with the respective source and gate pads of the discharging power transistor Q1 and the charging power transistor Q2 but also with the common drain pad. Thus, the layout configuration of the bidirectional CSP1 is realized which is capable of easily realizing the circuit's feature point that the protection diode PD is coupled between the common drain terminal CTE of the bidirectional CSP1 and the power supply terminal VCC of the control unit CU. The layout configuration of the bidirectional CSP1 in the present embodiment will be described below.

<Layout Configuration of Bidirectional CSP>

Figure 12:
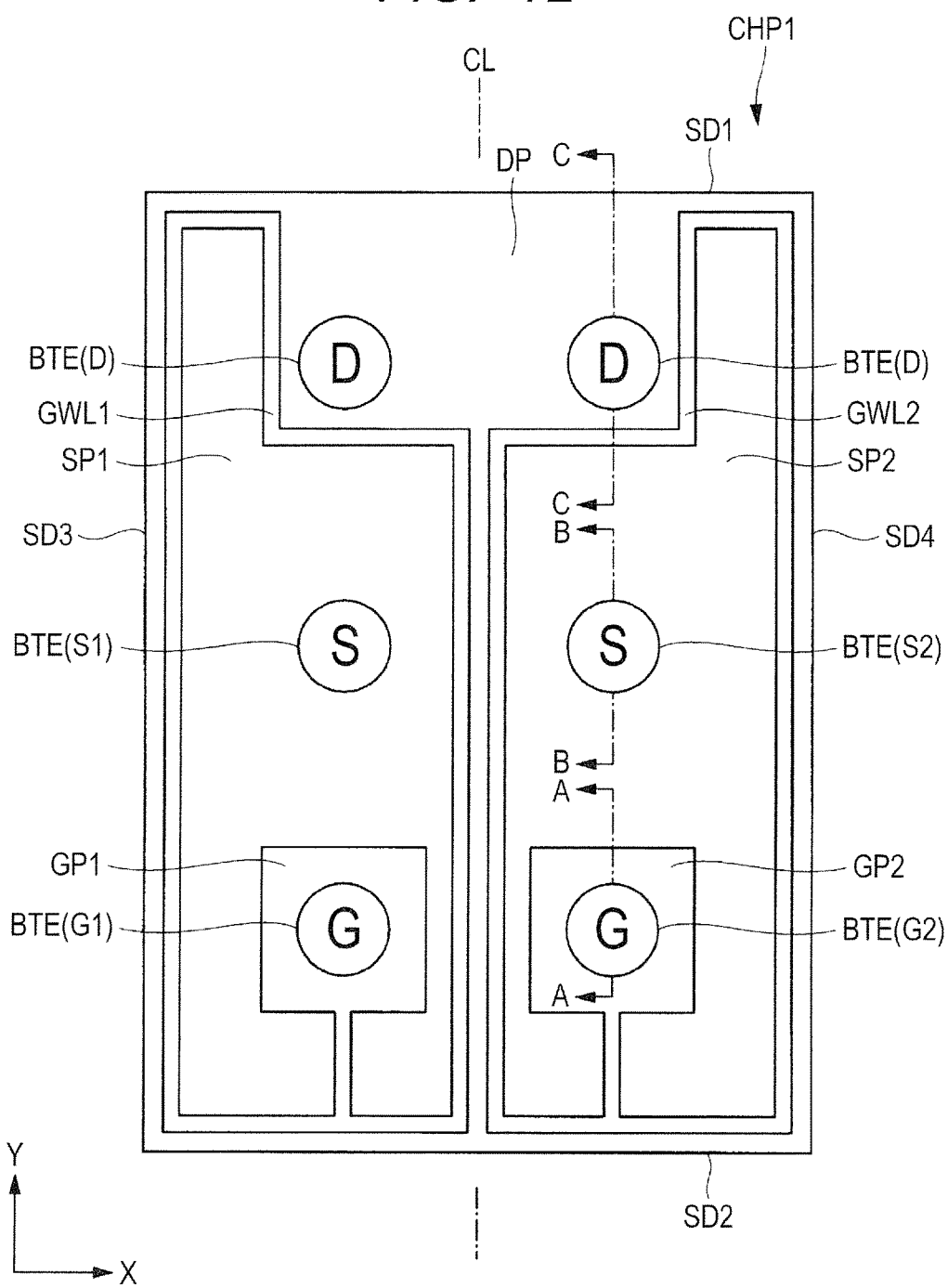
FIG. 12 is a top diagram showing a layout configuration of a semiconductor chip for realizing a bidirectional CSP in the embodiment.

FIG. 12 is a top diagram showing a layout configuration of a semiconductor chip CHP1 for realizing the bidirectional CSP1 in the present embodiment. In FIG. 12, the semiconductor chip CHP1 in the present embodiment is formed in, for example, a planar shape rectangular in shape. The semiconductor chip CHP1 has a pair of sides SD1 and SD2 opposite to each other and has a pair of sides SD3 and SD4 opposite to each other.

Then, a source pad SP1 which functions as a source of a discharging power transistor, a gate pad GP1 which functions as a gate of the discharging power transistor, a source pad SP2 which functions as a source of a charging power transistor, and a gate pad GP2 which functions as a gate of the charging power transistor are formed over the surface of the semiconductor chip CHP1. Further, a common drain pad DP which functions as a drain of the discharging power transistor and also functions as a drain of the charging power transistor is formed over the surface of the semiconductor chip CHP1.

As shown in FIG. 12, the common drain pad DP is arranged at a position where the distance between the side SD1 and the common drain pad DP becomes shorter than the distance between the side SD2 and the common drain pad DP. Specifically, in the present embodiment, the common drain pad DP is arranged at a position in contact with the side SD1 of the semiconductor chip CHP1. Further, an EQR (EQui-potential Ring) electrode is formed in the outer edge portion of the surface of the semiconductor chip CHP1. Then, the common drain pad DP is electrically coupled to the EQR electrode formed along the outer edge portion of the surface of the semiconductor chip CHP1. The EQR electrode is electrically coupled to a drain electrode formed at the back surface of the semiconductor chip CHP1 and becomes equipotential to the drain electrode. The EQR electrode has the function of making improving an extension of a depletion layer in a transverse direction and enhancing its breakdown voltage by making even the lateral outer edge portions equipotential to a drain potential as well as at the back surface of the semiconductor chip CHP1.

Next, a gate wiring GWL1 and a gate wiring GWL2 are formed separately from each other along an inside area surrounded by the common drain pad DP and the EQR electrode. And the source pad SP1 is formed within an area surrounded by the gate wiring GWL1, and the source pad SP2 is formed within an area surrounded by the gate wiring GWL2. That is, the source pad SP1 and the source pad SP2 are arranged apart from each other. Further, the gate pad GP1 is formed so as to be included in the source pad SP1 in plan view. The gate pad GP1 and the gate wiring GWL1 are electrically coupled to each other. Likewise, the gate pad GP2 is formed so as to be included in the source pad SP2 in plan view. The gate pad GP2 and the gate wiring GWL2 are electrically coupled to each other.

Now when a line connecting the center of the side SD1 and the center of the side SD2 is taken to be a center line CL, the common drain pad DP is symmetrical with respect to the center line CL. Further, for example, the source pad SP1 and the source pad SP2 are arranged symmetrically with respect to the center line CL. Likewise, the gate pad GP1 and the gate pad GP2 are arranged symmetrically with respect to the center line CL. Thus, the symmetry of the discharging power transistor and the charging power transistor formed in the semiconductor chip CHP1 can be enhanced. That is, according to the present embodiment, the uniformity of electrical characteristics can be improved by enhancing the symmetry of the discharging power transistor and the charging power transistor.

Further, as shown in FIG. 12, each of the area of the source pad SP1 and the area of the source pad SP2 is larger than the area of the common drain pad DP in plan view. The area of the common drain pad DP is larger than each of the area of the gate pad GP1 and the area of the gate pad GP2 in plan view. Besides, the area of the source pad SP1 and the area of the source pad SP2 are equal to each other, and the area of the gate pad GP1 and the area of the gate pad GP2 are equal to each other.

Subsequently, ball terminals are mounted over the source pads SP1 and SP2, the gate pads GP1 and GP2, and the common drain pad DP, respectively. Specifically, as shown in FIG. 12, a ball terminal BTE (S1) is mounted over the source pad SP1, and a ball terminal BTE (S2) is mounted over the source pad SP2. Likewise, a ball terminal BTE (G1) is mounted over the gate pad GP1, and a ball terminal BTE (G2) is mounted over the gate pad GP2. Further, a plurality of ball terminals BTE (D) are mounted over the common drain pad DP.

Described specifically, as shown in FIG. 12, six ball terminals are formed over the surface of the semiconductor chip CHP1. The ball terminals are arranged in a matrix form in a row direction (X direction)×a column direction (Y direction). In FIG. 12, for example, six ball terminals are arranged in a layout of n rows×m columns=3 rows×2 columns. The six ball terminals are included of the two ball terminals BTE (D), the ball terminals BTE (S1) and BTE (S2), and the ball terminals BTE (G1) and BTE (G2). For example, the two ball terminals BTE (D) mounted over the common drain pad DP are arranged at a position close to the side SD1 of the semiconductor chip CHP1. The ball terminal BTE (G1) mounted over the gate pad GP1 and the ball terminal BTE (G2) mounted over the gate pad GP2 are respectively arranged at a position closed to the side SD2 of the semiconductor chip CHP1. Further, the ball terminal BTE (S1) mounted over the source pad SP1 and the ball terminal BTE (S2) mounted over the source pad SP2 are arranged in the midway between the sides SD1 and SD2 of the semiconductor chip CHP1. These six ball terminals are terminals included of, for example, solder balls or the like, which are substantially circular as seen in top view, but may be configured of terminals each having an arbitrary shape such as a square shape besides.

<Layout Features in the Embodiment>

Now, a feature point on the layout in the present embodiment resides in that as shown in FIG. 12, for example, the common drain pad DP is formed over the surface of the semiconductor chip CHP1. That is, the layout feature point in the present embodiment resides in that the common drain pad DP is formed over the surface of the semiconductor chip CHP1 together with the source pad SP1 and the source pad SP2, and the gate pad GP1 and the gate pad GP2. Thus, according to the present embodiment, when the semiconductor chip CHP1 is face-down mounted over the wiring board, not only the respective source pads (SP1, SP2) and gate pads (GP1, GP2) of the discharging power transistor and the charging power transistor, but also the common drain pad DP can be electrically coupled to its corresponding wiring of the wiring board. Therefore, according to the present embodiment, each external circuit element mounted over the wiring board and the common drain pad DP can be electrically coupled to each other. Thus, if the bidirectional CSP1 is configured using the semiconductor chip CHP1 configured in this way, it is possible to easily realize the feature point on the circuit that the protection diode PD is coupled between the common drain terminal CTE of the bidirectional CSP1 and the power supply terminal VCC of the control unit CU such as shown in FIGS. 7 to 11, for example. That is, according to the layout feature point in the present embodiment, there can be obtained an advantage that it is possible to easily realize the configuration that the common drain terminal CTE of the bidirectional CSP1 is electrically coupled to the external circuit element (e.g., protection diode PD).

Incidentally, the semiconductor chip CHP1 in the present embodiment is useful from the viewpoint of realizing the configuration that the common drain terminal CTE of the bidirectional CSP1 is electrically coupled to the external circuit element, but is not limited to such a configuration. The semiconductor chip CHP1 can be applied as the bidirectional CSP2 in the related art shown in FIGS. 2 to 6, for example. That is, although the common drain of the bidirectional CSP2 is not electrically coupled to the external circuit element in the related art, it is good just to avoid using the common drain terminal CTE for the coupling to the external circuit element even if the semiconductor chip CHP1 in the present embodiment is used. Even when the semiconductor chip CHP1 in the present embodiment is used, the circuit in the related art can be easily realized.

Thus, the semiconductor chip CHP1 in the present embodiment is useful from the viewpoint of realizing the configuration that the common drain terminal CTE of the bidirectional CSP1 is electrically coupled to the external circuit element, but is not limited to such a configuration. It is possible to provide the semiconductor chip CHP1 high in versatility in that it can be applied even to the configuration that the common drain terminal CTE is not used in the connection with the external circuit element. That is, according to the present embodiment, there can be obtained an advantage that the semiconductor chip CHP1 can be provided which is wide in the scope of application and excellent in versatility.

<Device Structure of Semiconductor Chip>

A description will next be made about a device structure of the semiconductor chip CHP1 in the present embodiment. The semiconductor chip CHP1 in the present embodiment is formed with, for example, a discharging power transistor and a charging power transistor each included of a vertical transistor which allows current to flow in the thickness direction of the semiconductor chip. Specifically, in FIG. 12, the discharging power transistor is formed in the left area of the center line CL, and the charging power transistor is formed in the right area of the center line CL. Further, the common drain pad DP shown in FIG. 12 functions as the drain of the discharging power transistor formed in the left area of the center line CL and also functions as the drain of the charging power transistor formed in the right area of the center line CL. That is, the drains of the discharging power transistor and the charging power transistor both formed in the semiconductor chip CHP1 are electrically coupled to each other.

Figure 13:
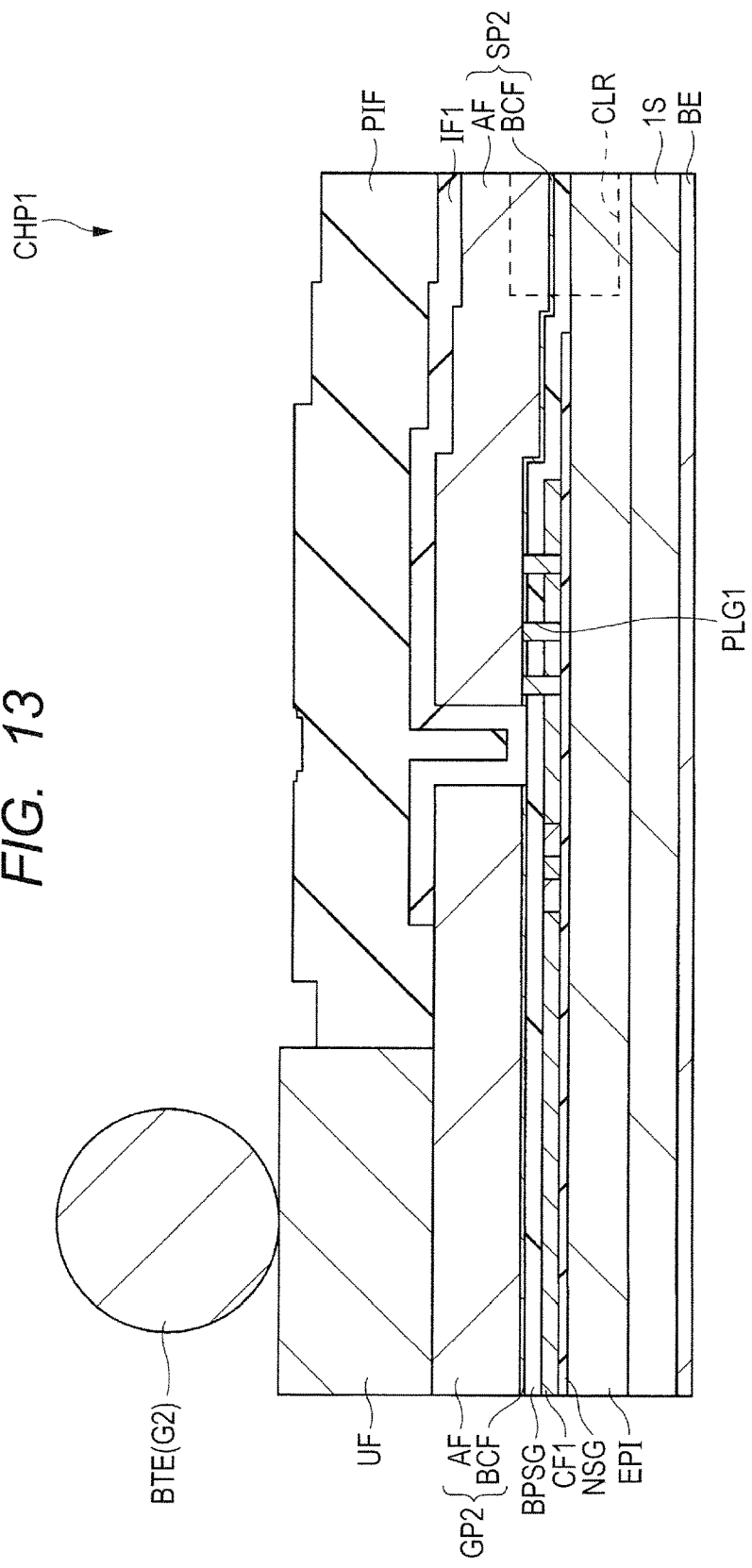
FIG. 13 is a sectional diagram cut off along line A-A of FIG. 12.

FIG. 13 is a sectional diagram cut along line A-A of FIG. 12. Since the sectional diagram cut along line A-A of FIG. 12 is a sectional diagram in the right area of the center line CL, it corresponds to a device structure of the charging power transistor. Since, however, the semiconductor chip CHP1 in the present embodiment has a structure symmetric relative to the center line CL, a device structure of the discharging power transistor is also similar. Since a sectional diagram cut along line B-B of FIG. 12 and a sectional diagram cut along line C-C of FIG. 12 both of which are shown below, are also sectional diagrams in the right area of the center line CL, they correspond to the device structure of the charging power transistor. Since, however, the semiconductor chip CHP1 in the present embodiment has the structure symmetric with respect to the center line CL, the device structure of the charging power transistor is also similar.

In FIG. 13, the semiconductor chip CHP1 in the present embodiment has a semiconductor substrate 1S included of silicon, for example. A back electrode BE is formed at the back surface of the semiconductor substrate 1S. The back electrode BE is formed of, for example, a laminated film in which a titanium (Ti) film, a nickel (Ni) film, and a silver (Ag) film are laminated in order from the semiconductor substrate 1S side.

On the other hand, an epitaxial layer EPI is formed over the surface of the semiconductor substrate 1S. A plurality of cell transistors which configure the charging power transistor are formed in a cell forming region CLR surrounded by a dotted line at the right edge of FIG. 13. The structure of the cell transistor will be described later.

Subsequently, an insulating film NSG is formed in a partial region of the surface of the epitaxial layer EPI. A conductor film CF1 included of, for example, a polysilicon film is formed over the insulating film NSG. The conductor film CF1 is electrically coupled to a gate electrode. Then, an insulating film BPSG is formed over the epitaxial layer EPI and the insulating film NSG which cover the conductor film CF1. A source pad SP2 and a gate pad GP2 are formed apart from each other over the insulating film BPSG. The source pad SP2 and the gate pad GP2 are respectively formed of, for example, a barrier conductor film BCF and an aluminum alloy film AF included of, for example, an AlSiCu film, an AlCu film or the like. At this time, the source pad SP2 is coupled to a plug PLG1 which penetrates the insulating film BPSG and the conductor film CF1. Further, since the conductor film CF1 is formed with a pn junction diode (constant voltage diode), the conductor film CF1 and the source pad SP2 electrically coupled to the gate electrode are coupled via the constant voltage diode having an electrostatic protection function. On the other hand, although not shown in FIG. 13, the conductor film CF1 electrically coupled to the gate electrode is electrically coupled to the upper gate pad GP2.

Next, an insulating film IF1 is formed so as to cover part of the source pad SP2 and the gate pad GP2. Further, a polyimide resin film PIF is formed over the insulating film IF1. While the source pad SP2 is covered with the insulating film IF1 and the polyimide resin film PIF in FIG. 13, the polyimide resin film PIF formed over the gate pad GP2 is formed with an opening. A ball terminal BTE (G2) is mounted via an underbump metal film UF over the surface of the gate pad GP2 exposed from the opening.

Figure 14:
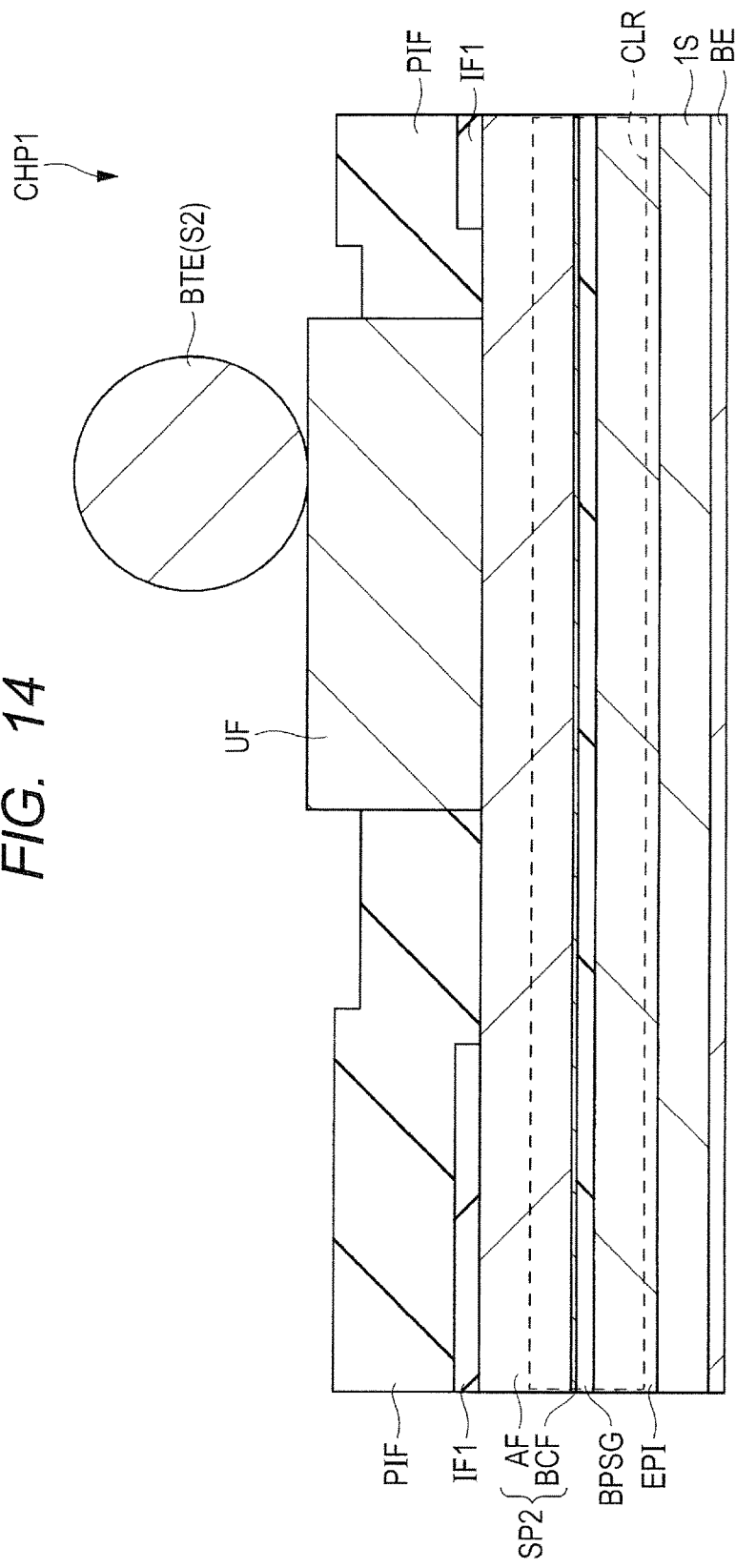
FIG. 14 is a sectional diagram cut off along line B-B of FIG. 12.

Subsequently, FIG. 14 is a sectional diagram cut along line B-B of FIG. 12. In FIG. 14, the epitaxial layer EPI used as a drift layer is formed over the surface of the semiconductor substrate 1S formed with the back electrode BE at its back surface. The insulating film BPSG is formed over the epitaxial layer EPI. Incidentally, the cell transistors which configure the charging power transistor are formed in the cell forming region CLR surrounded by the dotted line.

Next, the source pad SP2 is formed over the insulating film BPSG, and the insulating film IF1 and the polyimide resin film PIF are formed over the source pad SP2. Then, the polyimide resin film PIF is formed with an opening. A ball terminal BTE (S2) is mounted over the surface of the source pad SP2 exposed from the opening through an underbump metal film UF.

Figure 15:
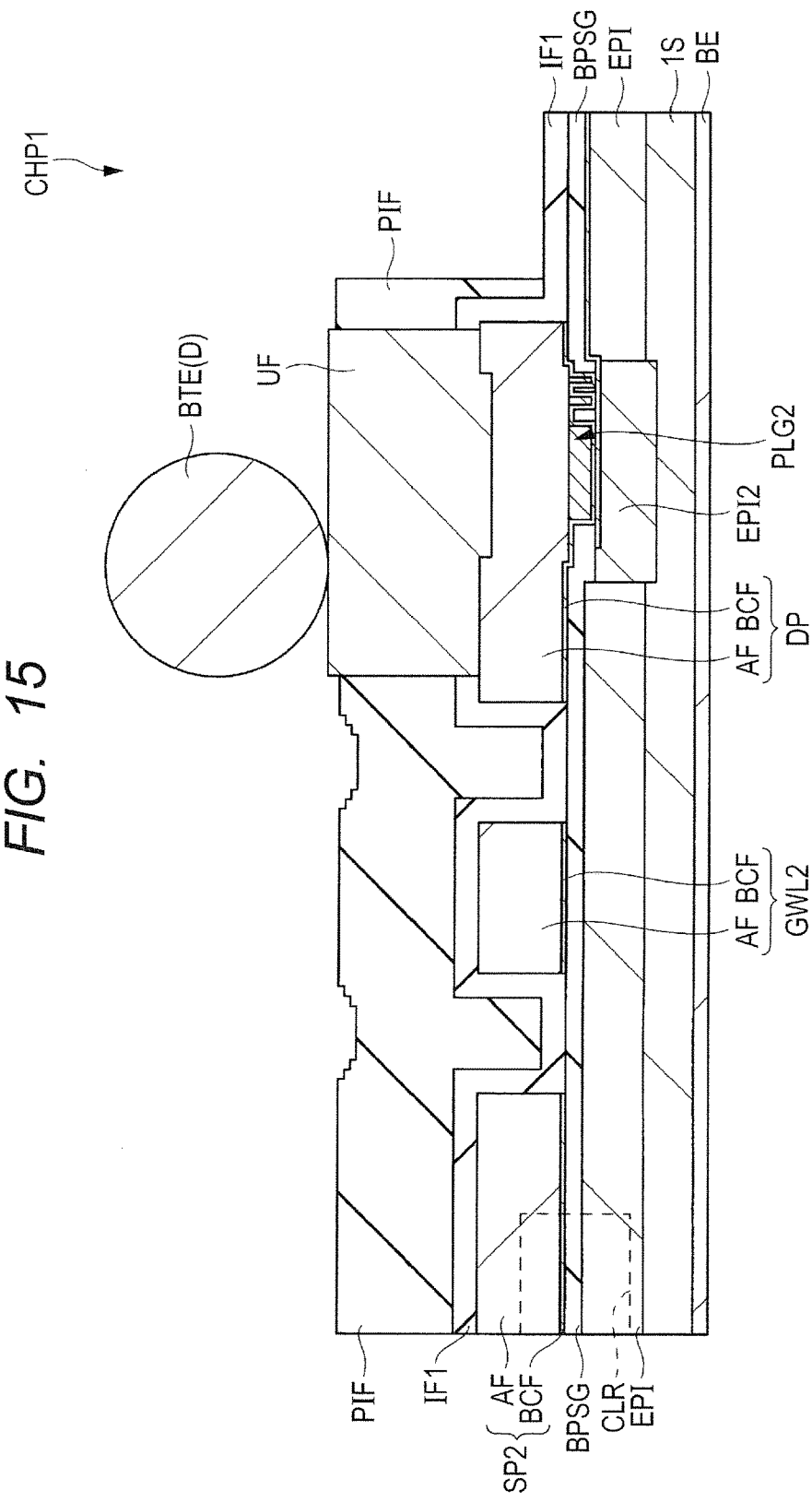
FIG. 15 is a sectional diagram cut off along line C-C of FIG. 12.

Subsequently, FIG. 15 is a sectional diagram cut along line C-C of FIG. 12. In FIG. 15, the epitaxial layer EPI which serves as the drift layer is formed over the surface of the semiconductor substrate 1S formed with the back electrode BE at its back surface. The insulating film BPSG is formed over the epitaxial layer EPI. Incidentally, the cell transistors which configure the charging power transistor are formed in the cell forming region CLR surrounded by the dotted line.

Here, as shown in FIG. 15, a common drain extraction region EPI2 is formed in part of the epitaxial layer EPI. And the source pad SP2, the gate wiring GWL2, and the common drain pad DP are formed apart from each other over the insulating film BPSG. That is, the gate wiring GWL2 is formed so as to be separated from and sandwiched between the source pad SP2 and the common drain pad DP. These source pad SP2, gate wiring GWL2 and common drain pad DP are respectively formed of, for example, a barrier conductor film BCF and an aluminum alloy film AF. Further, the common drain pad DP and the common drain extraction region EPI2 are electrically coupled to each other via a plug PLG2.

Next, the insulating film IF1 and the polyimide resin film PIF are formed so as to cover the source pad SP2, the gate wiring GWL2 and the common drain pad DP arranged away from each other. An opening is formed in the polyimide resin film PIF and the insulating film IF1 so as to expose the surface of the common drain pad DP. The ball terminal BTE (D) is mounted via an underbump metal film UF over the surface of the common drain pad DP exposed from the opening.

Figure 16:
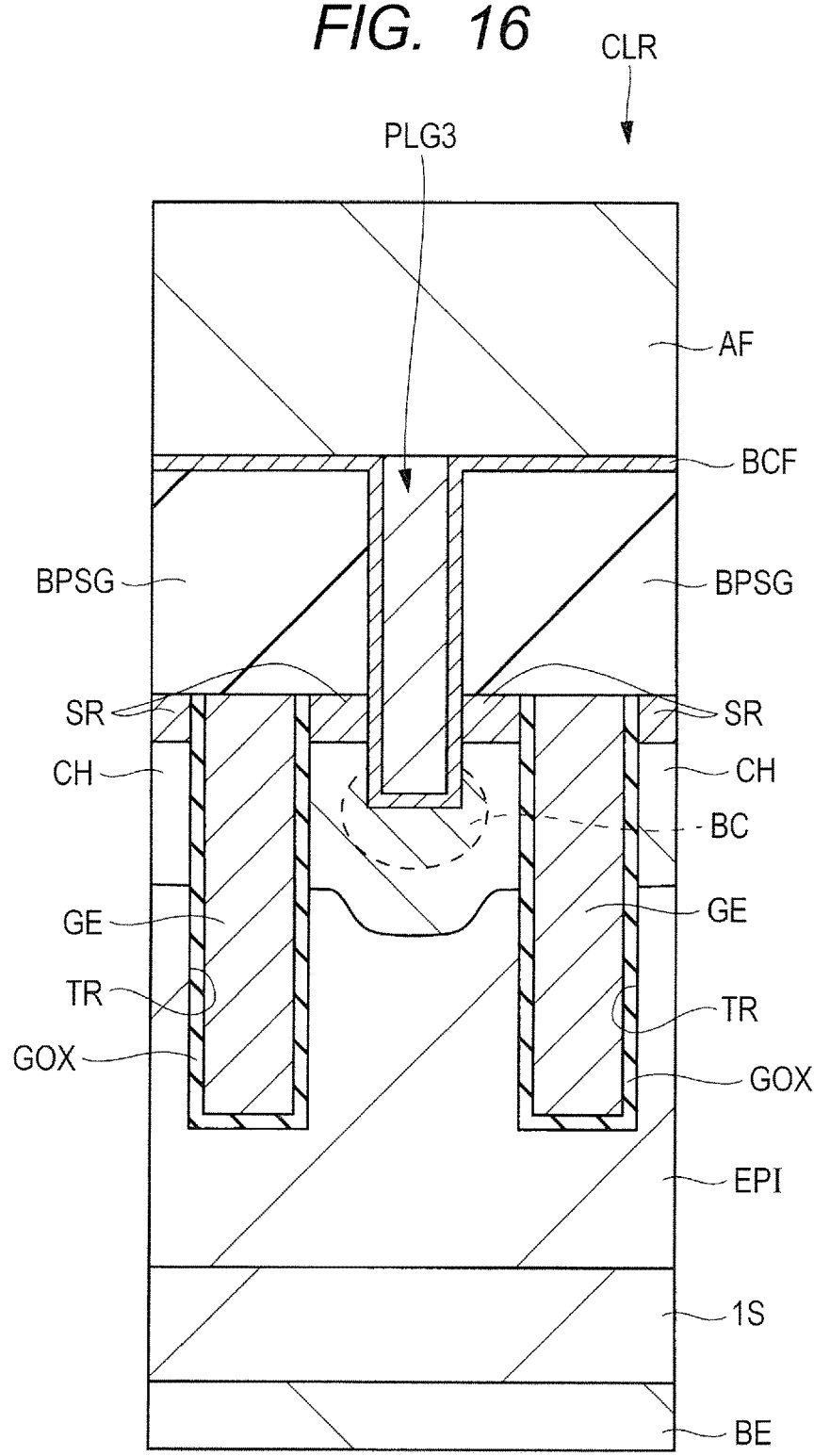
FIG. 16 is a sectional diagram showing one example of a device structure of a cell transistor formed in a cell forming region.

Subsequently, a description will be made about the device structure of the cell forming region CLR surrounded by the dotted line shown in each of FIGS. 13 to 15. FIG. 16 is a sectional diagram showing one example of the device structure of the cell transistor formed in the cell forming region CLR.

In FIG. 16, an epitaxial layer EPI is formed over a semiconductor substrate 1S included of silicon containing an n-type impurity such as phosphorus (P), arsenic (As) or the like. The epitaxial layer EPI is included of a semiconductor layer with silicon introduced with an n-type impurity such as phosphorus (P), arsenic (As) or the like being taken as a principal component. The semiconductor substrate 1S and the epitaxial layer EPI are components which function as the drains of power transistors (discharging power transistor and charging power transistor).

Then, an element part is formed in the surface of the epitaxial layer EPI. Specifically, the element part in the present embodiment is formed with a channel region CH at the surface of the epitaxial layer EPI and formed with trenches TR which penetrate the channel region CH and reach the epitaxial layer EPI. At this time, a gate insulting film GOX is formed over the inner wall of each trench TR. A gate electrode GE is formed over the gate insulating film GOX so as to fill in the trench TR. The gate insulating film GOX is formed of, for example, a silicon oxide film, but is not limited thereto. The gate insulating film GOX can also be formed of, for example, a high dielectric constant film higher in permittivity than the silicon oxide film. Further, the gate electrode GE is formed of, for example, a polysilicon film.

Then, a source region SR is formed in the surface of the channel region CH adjacent to each trench TR. Further, an insulating film BPSG is formed over the upper surface of each trench TR with the gate electrode GE embedded therein and the source region SR. The channel region CH is included of a semiconductor region introduced with a p-type impurity such as boron (B) or the like. The source region SR is included of a semiconductor region introduced with an n-type impurity such as phosphorus (P), arsenic (As) or the like.

Next, a groove which penetrates the insulating film BPSG and the source region SR and reaches the channel region CH is formed between the trenches TR adjacent to each other. A body contact region BC is formed at the bottom of the groove. The body contact region BC is included of a semiconductor region introduced with a p-type impurity such as boron (B) or the like. An impurity concentration of the body contact region BC is higher than that of the channel region CH.

Subsequently, a barrier conductor film BCF and a plug PLG3 included of a tungsten film are formed so as to bury the groove formed with the body contact region BC at its bottom. The barrier conductor film BCF and an aluminum alloy film AF are formed over the insulating film BPSG including above the plug PLG3. Thus, the aluminum alloy film AF is electrically coupled to the source region SR and electrically coupled even to the channel region CH via the body contact region BC.

At this time, the body contact region BC has the function of ensuring ohmic contact with the plug PLG3. With the existence of the body contact region BC, the source region SR and the channel region CH are electrically coupled to each other at the same potential.

Thus, it is possible to suppress the on operation of a parasitic npn bipolar transistor in which the source region SR is defined as an emitter region, the channel region CH is defined as a base region, and the epitaxial layer EPI is defined as a collector region. That is, the electrical coupling of the source region SR and the channel region CH to each other at the same potential means that no potential difference occurs between the emitter and base regions of the parasitic npn bipolar transistor. It is thus possible to suppress the on operation of the parasitic npn bipolar transistor.

The device structure of each of the power transistors (discharging power transistor and charging power transistor) is formed inside the semiconductor chip CHP1 in the present embodiment in the above-described manner.

<Features on Device Structure in the Embodiment>

Here, a feature point on the device structure in the present embodiment resides in that as shown in FIG. 15, for example, the impurity concentration of the common drain extraction region EPI2 which is coupled to the common drain pad DP through the plug PLG2 and formed at the position where it overlaps with the common drain pad PD in plan view, is higher than that of the epitaxial layer EPI. Thus, the on resistance of a current path which leads to the (epitaxial layer EPI+semiconductor substrate 1S+back electrode BE)→the common drain extraction region EPI2→the plug PLG2→the common drain pad DP can be reduced. That is, in the present embodiment, the common drain pad DP is formed at the surface of the semiconductor chip CHP1, and the common drain extraction region EPI2 is formed in a path from the epitaxial layer EPI+semiconductor substrate 1S+back electrode BE formed in the semiconductor chip CHP1 to the common drain pad DP formed therein. At this time, a reduction in the resistance of the common drain extraction region EPI2 can be achieved by setting the impurity concentration of the common drain extraction region EPI2 higher than that of the epitaxial layer EPI. It is thus possible to achieve a reduction in the on resistance.

In the present embodiment in particular, the on resistance can be reduced by forming the common drain extraction region EPI2 so as to reach the inside of the semiconductor substrate 1S as shown in FIG. 15. That is, the on resistance can be reduced by deeply forming the common drain extraction region EPI2 corresponding to a high concentration impurity region to the degree reaching the inside of the high concentration semiconductor substrate 1S as compared with the case where the common drain extraction region EPI2 is shallowly formed within the epitaxial layer EPI corresponding to a low concentration impurity region.

Figure 17:
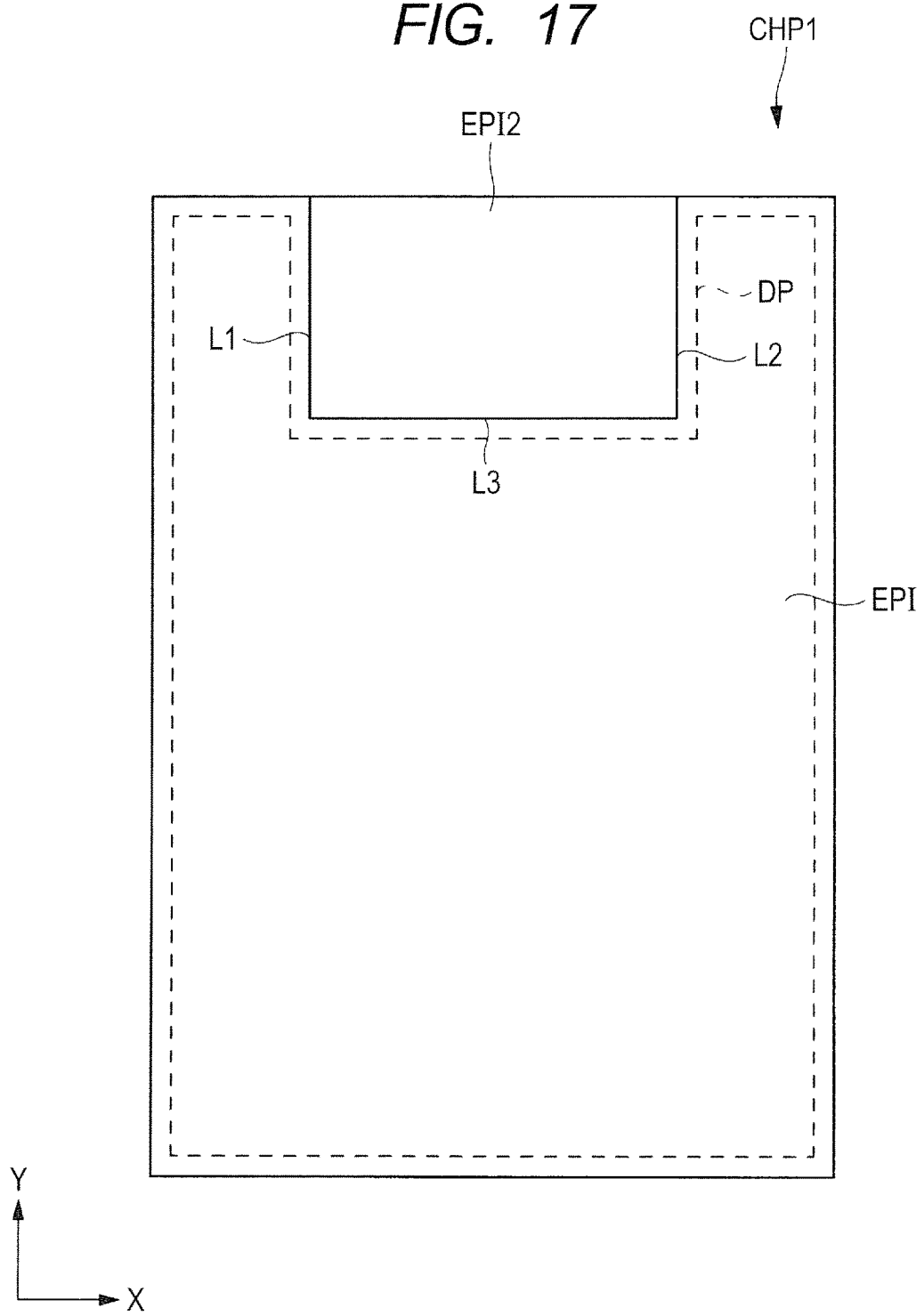
FIG. 17 is atypical diagram showing only an epitaxial layer, a common drain extraction region, and a common drain pad while paying attention to these components in the embodiment.

Further, the present embodiment has been devised from the viewpoint of reducing the on resistance. FIG. 17 is a typical diagram showing only the epitaxial layer EPI, the common drain extraction region EPI2, and the common drain pad DP while paying attention to these components in the present embodiment. As shown in FIG. 17, in the present embodiment, the common drain extraction region EPI2 is included in the common drain pad DP in plan view. Further, as shown in FIG. 17, a boundary line between the common drain extraction region EPI2 and the epitaxial layer EPI includes at least a pair of opposed lines (L1 and L2) opposite to each other and a single crossing line L3 connecting the pair of opposed lines (L1 and L2) in plan view. Thus, according to the present embodiment, the area of the boundary region between the common drain extraction region EPI2 and the epitaxial layer EPI with respect to the plane area of the common drain extraction region EPI2 can be increased. As a result, a current which flows through the low resistance common drain extraction region EPI2 is increased, thereby making it possible to achieve a reduction in the on resistance.

Figure 18:
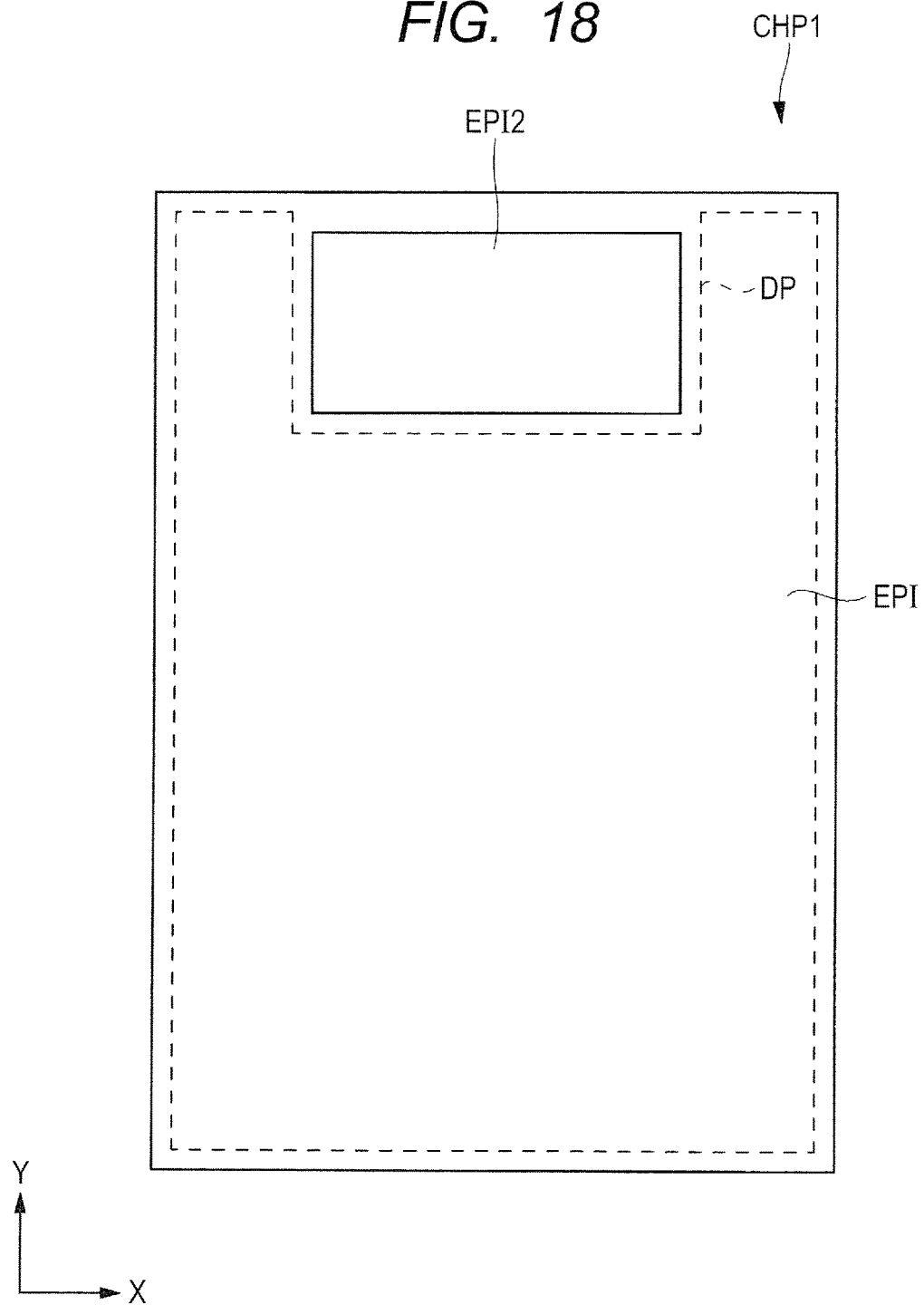
FIG. 18 is atypical diagram showing only an epitaxial layer, a common drain extraction region, and a common drain pad while paying attention to these components in the embodiment.

Further, FIG. 18 is also a typical diagram showing only the epitaxial layer EPI, the common drain extraction region EPI2, and the common drain pad DP while paying attention to these components in the present embodiment. As shown in FIG. 18, the common drain extraction region EPI2 is surrounded by the epitaxial layer EPI in plan view. Thus, according to the present embodiment, the area of the boundary region between the common drain extraction region EPI2 and the epitaxial layer EPI with respect to the plane area of the common drain extraction region EPI2 can be further increased. As a result, a current which flows through the low resistance common drain extraction region EPI2 is increased, thereby making it possible to achieve a reduction in the on resistance.

<Modification 1>

Figure 19:
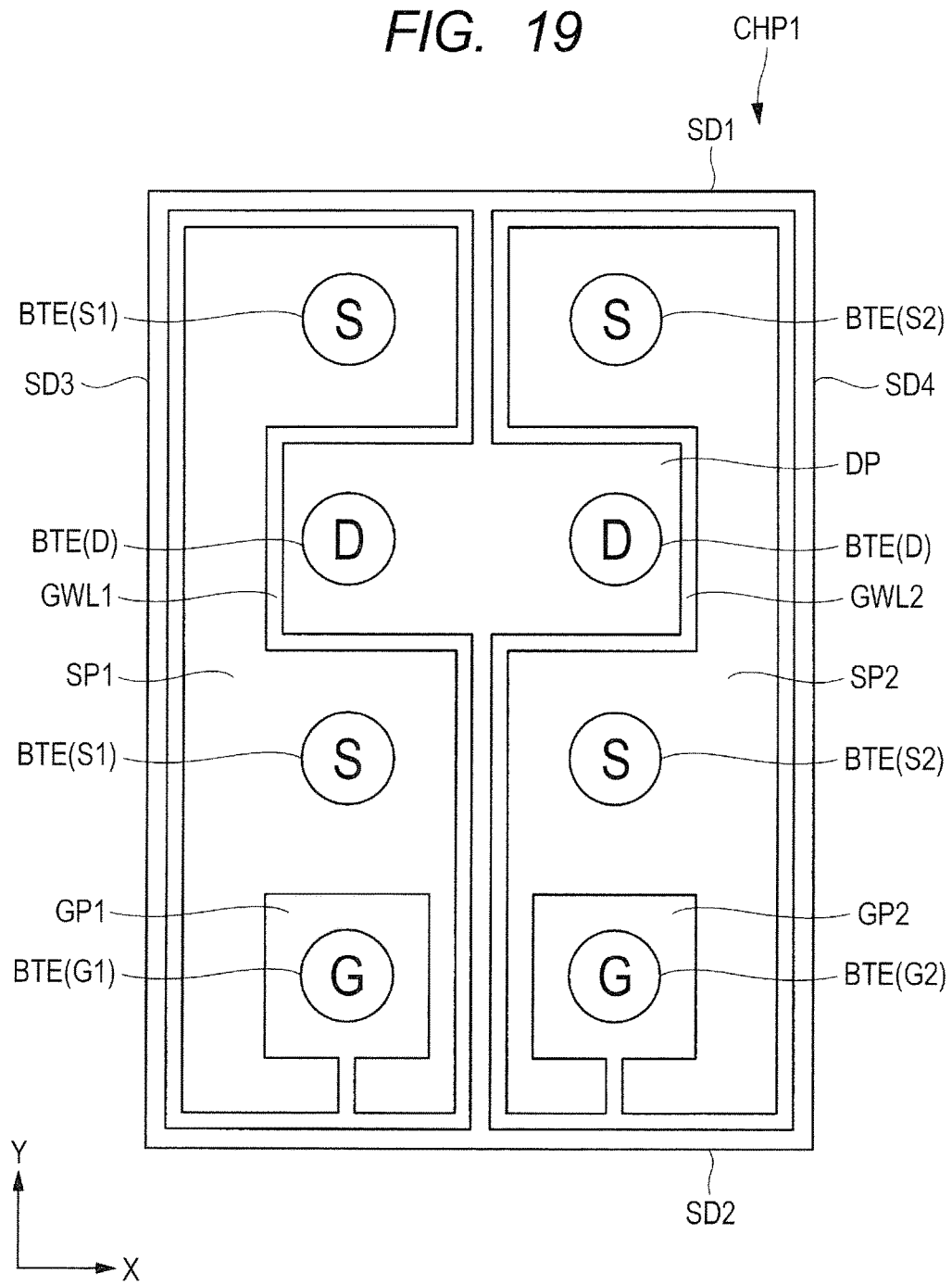
FIG. 19 is a plan diagram showing a layout configuration of a semiconductor chip in a modification 1.

FIG. 19 is a plan diagram showing a layout configuration of a semiconductor chip CHP1 in the present modification 1. As shown in FIG. 19, in the semiconductor chip CHP1 in the present modification 1, a common drain pad DP is not arranged so as to contact a side SD1, but is arranged in such a manner that the distance between the side SD1 and the common drain pad DP is made shorter than that between a side SD2 and the common drain pad DP and so as to be separated from the side SD1. Further, two ball terminals BTE (S1) are arranged over a source pad SP1 so as to sandwich one ball terminal BTE (D) mounted over the common drain pad DP therebetween. Moreover, two ball terminals BTE (S2) are arranged over a source pad SP2 so as to sandwich one ball terminal BTE (D) mounted over the common drain pad DP therebetween. Thus, according to the present modification 1, the distance between the ball terminal BTE (D) mounted over the common drain pad DP and the ball terminal BTE (S1) mounted over the source pad SP1 can be made short. Likewise, according to the present modification 1, the distance between the ball terminal BTE (D) mounted over the common drain pad DP and the ball terminal BTE (S2) mounted over the source pad SP2 can be made short. As a result, according to the present modification 1, a current path between the common drain pad DP and the source pad SP1, and a current path between the common drain pad DP and the source pad SP2 can be made short, thereby making it possible to reduce the on resistances of the above-described current paths.

<Modification 2>

Figure 20:
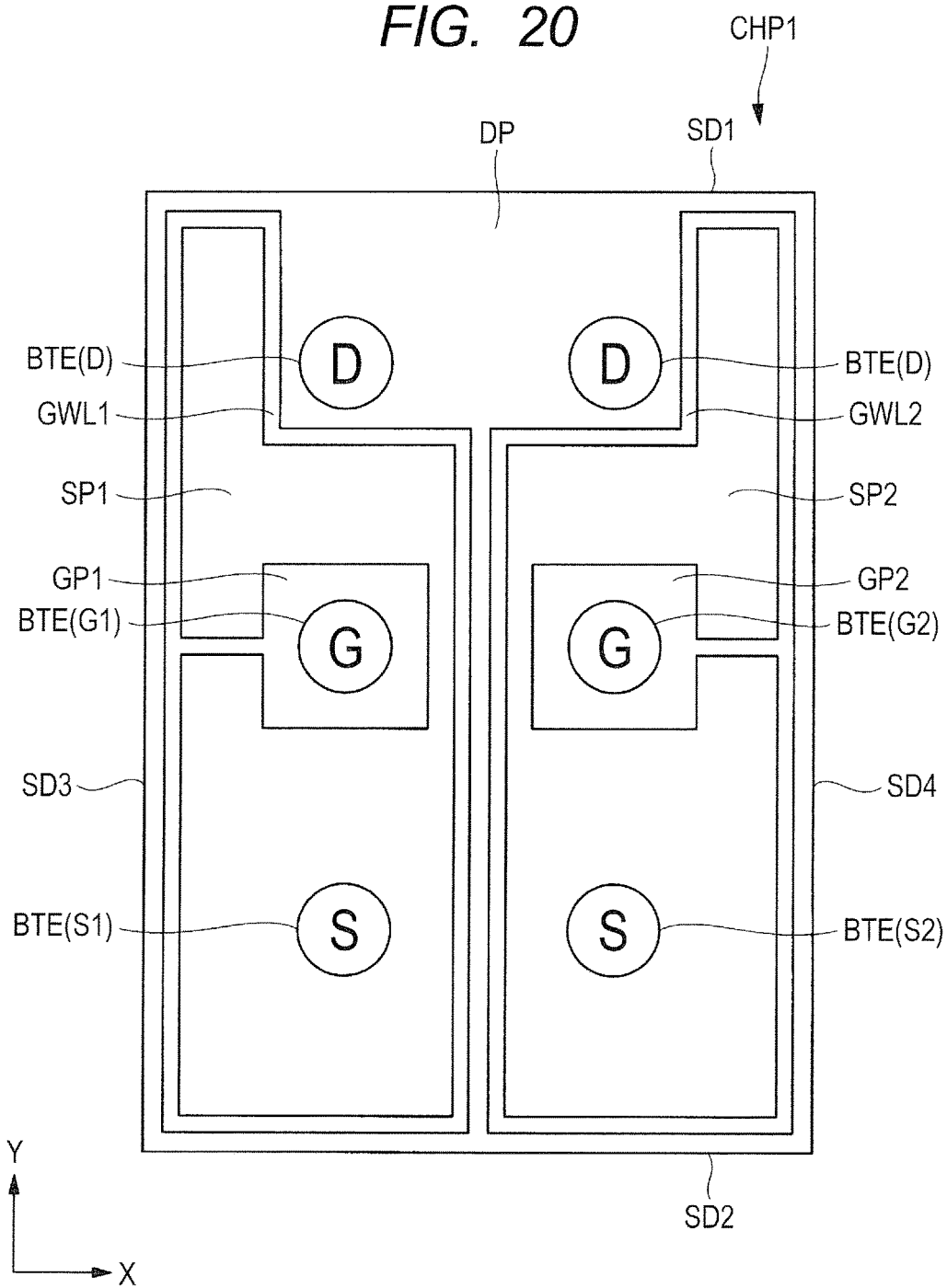
FIG. 20 is a plan diagram showing a layout configuration of a semiconductor chip in a modification 2.

FIG. 20 is a plan diagram showing a layout configuration of a semiconductor chip CHP1 in the present modification 2. As shown in FIG. 20, a gate pad GP1 and a gate pad GP2 are arranged in the center part of the semiconductor chip CHP1 in the present modification 2. Thus, as the layout configuration of the semiconductor chip CHP1, not only the layout configuration shown in FIG. 12, but also such a layout configuration as shown in FIG. 20 can be adopted.

<Modification 3>

Figure 21:
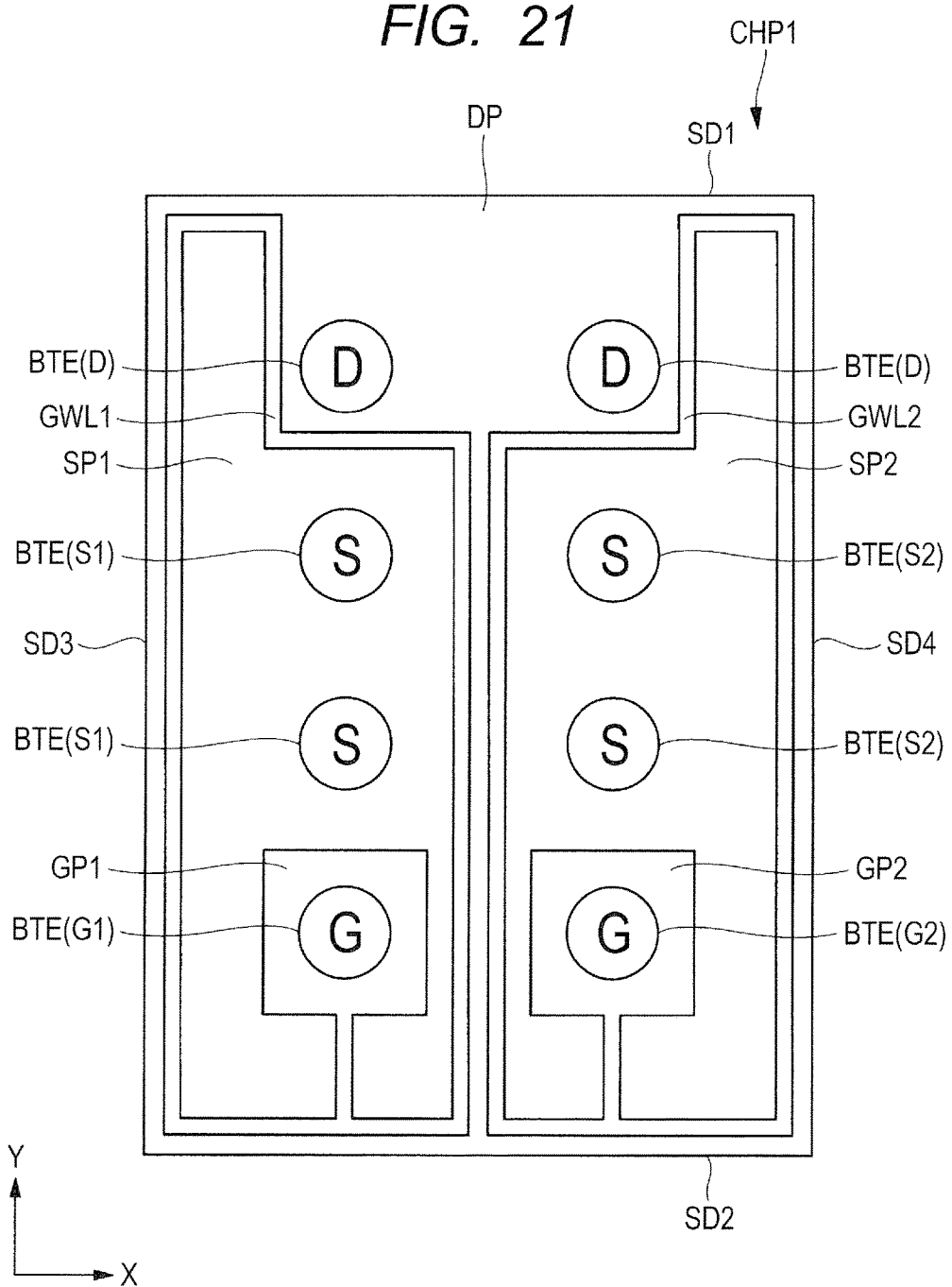
FIG. 21 is a plan diagram showing a layout configuration of a semiconductor chip in a modification 3.

FIG. 21 is a plan diagram showing a layout configuration of a semiconductor chip CHP1 in the present modification 3. As shown in FIG. 21, in the semiconductor chip CHP1 in the present modification 3, a plurality of ball terminals BTE (S1) are mounted over a source pad SP1, and a plurality of ball terminals BTE (S2) are mounted over a source pad SP2 (first factor). Thus, the distance between a ball terminal BTE (D) mounted over a common drain pad DP and the ball terminal BTE (S1) arranged on the common drain pad DP side can be made short (second factor). Likewise, the distance between a ball terminal BTE (D) mounted over the common drain pad DP and the ball terminal BTE (S2) arranged on the common drain pad DP side can be made short (second factor). Thus, according to the present modification 3, the on resistance can be reduced by the synergetic effect of the first factor by the provision of the ball terminals and the second factor by shortening of the distance.

<Modification 4>

Incidentally, although the embodiment has described the configuration example in which the ball terminals are provided over the source pads SP1 and SP2, the gate pads GP1 and GP2, and the common drain pad DP respectively, the technical idea in the embodiment is not limited to it, but can be applied even to, for example, a configuration free of provision of ball terminals.

<Mounting Configuration of Semiconductor Device in Embodiment>

A description will next be made about the mounting configuration of the semiconductor device equipped with the bidirectional CSP1, control unit CU, protection diode PD, and normally-on power transistor Q3 shown in FIG. 7.

Figure 22:
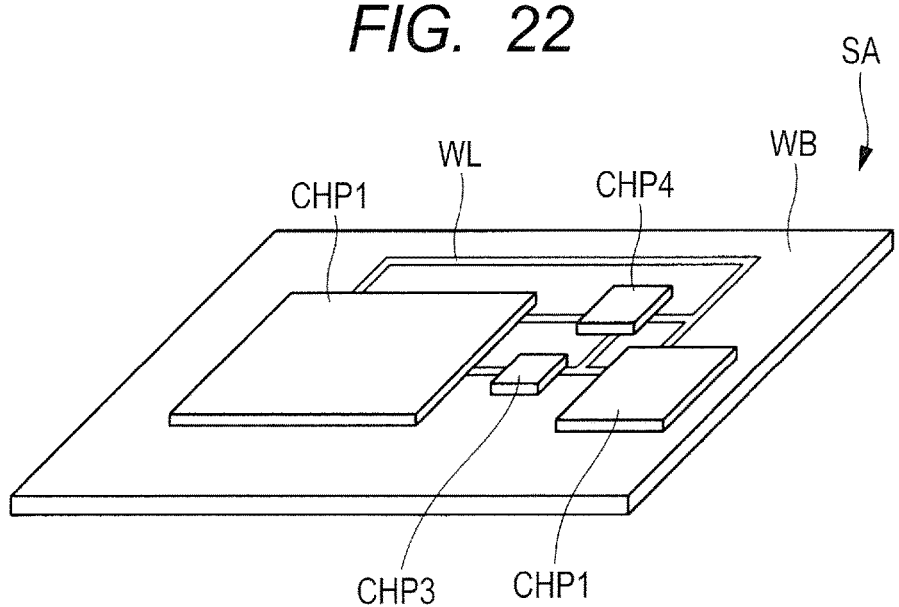
FIG. 22 is a perspective diagram typically showing a mounting configuration of a semiconductor device in an embodiment.

FIG. 22 is a perspective diagram typically showing a mounting configuration of a semiconductor device SA equipped with a semiconductor chip CHP1 which realizes the bidirectional CSP1 in the present embodiment, a semiconductor chip CHP2 which realizes the function of the control unit CU, a semiconductor chip CHP3 formed with the protection diode PD, and the normally-on power transistor Q3.

In FIG. 22, the semiconductor device SA in the present embodiment has a wiring board WB formed with a wiring WL. The semiconductor chip CHP1, semiconductor chip (control chip) CHP2, semiconductor chip (diode chip) CHP3, and semiconductor chip CHP4 are mounted over a main surface of the wiring board WB. Further, the semiconductor chips CHP1 to CHP4 are respectively electrically coupled by the wiring WL formed over the wiring board WB.

At this time, when attention is paid to the semiconductor chip CHP1 which realizes the bidirectional CSP1 in the present embodiment, a source pad of a discharging power transistor, a gate pad of the discharging power transistor, a source pad of a charging power transistor, a gate pad of the charging power transistor, and a common drain pad are formed at the surface of the semiconductor chip CHP1. Further, the semiconductor chip CHP1 is mounted over the wiring board WB in a state in which the surface of the semiconductor chip CHP1 is made opposite to the main surface of the wiring board WB.

Figure 23:
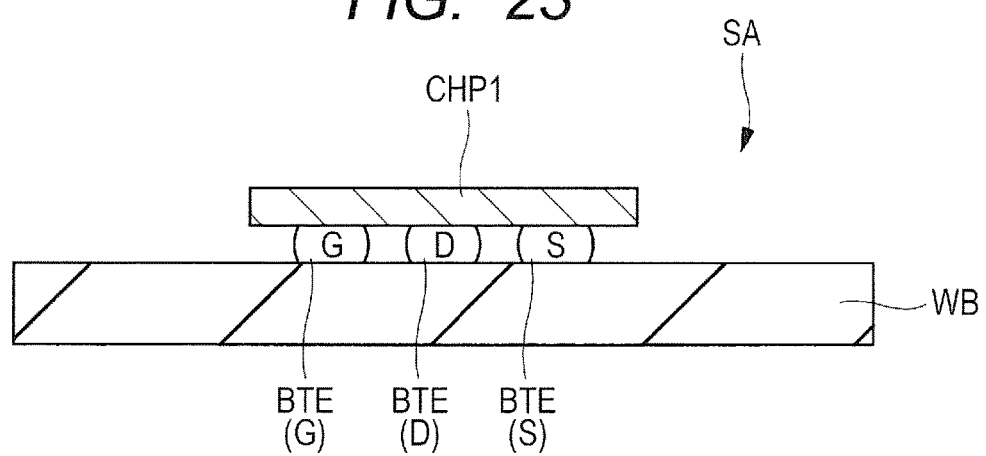
FIG. 23 is a sectional diagram showing a state in which a semiconductor chip is mounted over a wiring board in the embodiment.

FIG. 23 is a sectional diagram showing a state in which the semiconductor chip CHP1 is mounted over the wiring board WB. As shown in FIG. 23, for example, the wiring board WB and the semiconductor chip CHP1 are electrically coupled to each other through ball terminals (BTE (G), BTE (S) and BTE (D)). The semiconductor device SA in the present embodiment is mounted and configured in the above-described manner.

<Usability of Semiconductor Device in the Embodiment>

Figure 24:
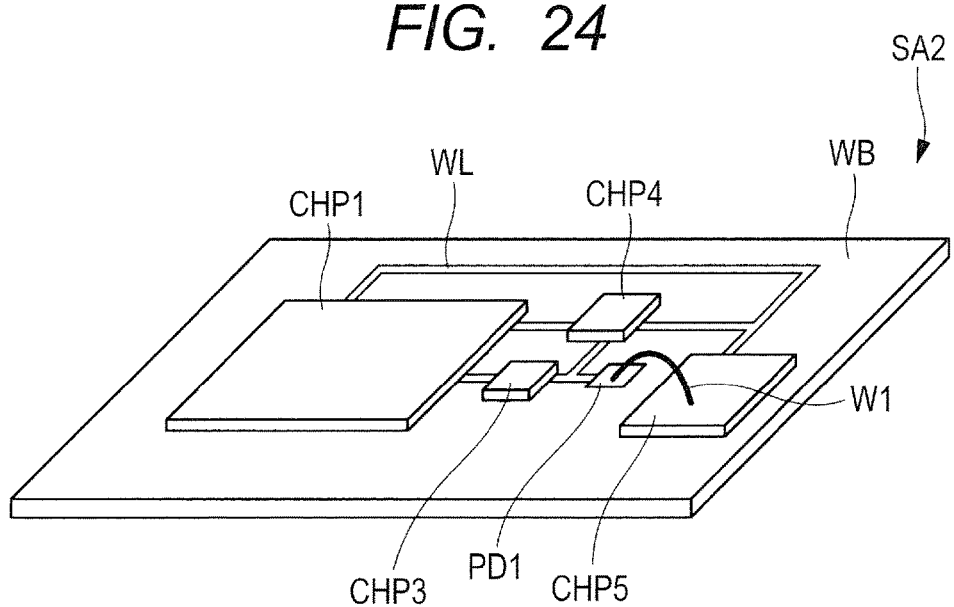
FIG. 24 is a perspective diagram typically showing a mounting configuration of a semiconductor device in a related art.
Figure 25:
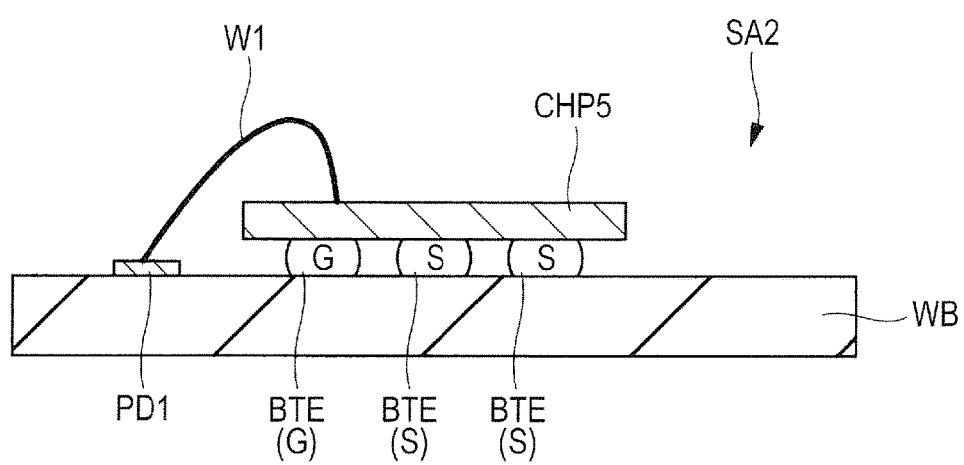
FIG. 25 is a sectional diagram showing a state in which a semiconductor chip is mounted over a wiring board in the related art.

Subsequently, the usability of the semiconductor device SA in the present embodiment will be described. FIG. 24 is a perspective diagram typically showing an example in which a semiconductor device SA2 having a function similar to the semiconductor device SA in the present embodiment is configured by mounting using a semiconductor chip CHP5 formed with the bidirectional CSP2 in the related art. That is, there is shown in FIG. 24, an example in which the semiconductor device SA2 having the function similar to the semiconductor device SA is configured by mounting using the semiconductor chip CHP5 with no common drain pad formed over the surface thereof. Since the common drain pad is not formed in the surface of the semiconductor chip CHP5 in FIG. 24, a drain electrode (back electrode) formed in the back surface, and a pad PD1 formed over the wiring board WB are electrically coupled by a wire W1. Specifically, FIG. 25 is a sectional diagram showing a state in which the semiconductor chip CHP5 is mounted over the wiring board WB. Since the wiring board WB and the semiconductor chip CHP5 are electrically coupled through ball terminals (BTE (G) and BTE (S)) but no common drain pad is formed in the semiconductor chip CHP5, as shown in FIG. 25, the drain electrode formed over the back surface of the semiconductor chip CHP5 directed to the upside, and the pad PD1 formed over the wiring board WB are coupled by the wire W1.

There is room for improvement shown below in the semiconductor device SA2 configured in this way. That is, firstly, the planar size of the wiring board WB shown in FIG. 24 becomes large by the synergistic factor of the point that the pad PD1 electrically coupled to the drain electrode formed at the back surface of the semiconductor chip CHP5 is provided over the wiring board WB, and the point that a coupling region of the wire W1 is ensured, thereby inhibiting miniaturization of the semiconductor device SA2.

Next, secondly, the degree of difficulty of assembling the semiconductor device SA2 becomes high with a rise in the manufacturing cost of the semiconductor device SA2 by providing the pad PD at the wiring board WB and using the wire W1 included of a gold wire.

Further, thirdly, there is concern that a parasitic resistance and a parasitic inductance will increase because the thin wire W1 is used and the drain electrode formed over the back surface of the semiconductor chip CHP5 and the pad PD1 provided over the wiring board WB are coupled by the wire W1. Consequently, there is a risk of causing degradation of the electrical characteristics of the semiconductor device SA2.

Moreover, fourthly, the drain electrode formed over the back surface of the semiconductor chip CHP5 becomes an exposed state because it is necessary to electrically couple the drain electrode to the wire W1. In this case, there is a possibility that a short circuit failure will occur between the back surface of the semiconductor chip CHP5 and the wire WL of the wiring board WB due to, for example, a foreign substance produced by chopping or the like of the semiconductor chip CHP5. Thus, there is concern that the reliability of the semiconductor device SA2 will be degraded.

In regard to this point, according to the semiconductor device SA2 in the present embodiment shown in FIG. 22, the common drain pad is formed over the surface of the semiconductor chip CHP1, and the face-down mounting is performed in the state in which the surface of the semiconductor chip CHP1 is made opposite to the main surface of the wiring board WB. This means that the common drain pad formed over the surface of the semiconductor chip CHP1 and the wiring WL formed over the main surface of the wiring board WB can be electrically coupled by the face-down mounting. That is, in the semiconductor chip CHP1 in the present embodiment, there is no need to couple the drain electrode formed over the back surface and the wiring board WB by the wire W1. Thus, in the present embodiment, it is possible for the semiconductor device SA to achieve a reduction in its planar size as compared with the semiconductor device SA2 by the synergistic effect of the point that the pad PD1 is not required to be provided in the wiring board WB and the point that the coupling region (coupling space) of the wire W1 is not required to be ensured because no wire W1 is used, as it is understood from the contrast between FIG. 22 and FIG. 24, for example.

Then, according to the semiconductor device SA in the present embodiment, the pad PD1 is not required to be provided in the wiring board WB, and the wire W1 is not required to be used, thereby making it possible to suppress a rise in the manufacturing cost of the semiconductor device SA2 and suppress an increase in the degree of difficulty of assembling the semiconductor device SA2.

Further, according to the present embodiment, since the thin wire W1 is not required to be used, the parasitic resistance and the parasitic inductance caused by using the wire W1 can be suppressed from increasing. Thus, it is possible to achieve an improvement in the electrical characteristics of the semiconductor device SA2.

Moreover, according to the present embodiment, since the drain electrode formed over the back surface of the semiconductor chip CHP1 is not used for electrical coupling, the drain electrode can be covered with an insulating film, for example. In this case, for example, even when the foreign substance produced by chopping or the like of the semiconductor chip CHP1 is adhered between the semiconductor chip CHP1 and the wiring board WB, the occurrence of a short circuit failure between the back surface of the semiconductor chip CHP1 and the wiring WL of the wiring board WB can be avoided by the existence of the insulating film which covers the drain electrode. As a result, according to the present embodiment, the reliability of the semiconductor device SA can be improved. It is understood from the above that the semiconductor device SA in the present embodiment shown in FIG. 22 has excellent usability as compared with the semiconductor device SA2 shown in FIG. 24.

<Devise for Realizing Reduction in on Resistance>
(Supplement 1)

A description will next be made about a supplemental point (supplement 1) in the present embodiment. In the present embodiment, the common drain pad is provided at the surface of the semiconductor chip CHP1. Further, the back side of the semiconductor chip CHP1 and the common drain pad on the surface side of the semiconductor chip CHP1 are required to be electrically coupled to each other, and the coupling circuit becomes long. It is therefore important to achieve a reduction in the on resistance.

In regard to this point, the present inventors have newly found that the effect of reducing the on resistance can be obtained by making thick the thickness of the aluminum alloy film that configures the common drain pad, and the thickness of the silver film that configures the back electrode (drain electrode). This point will be described.

Figure 26:
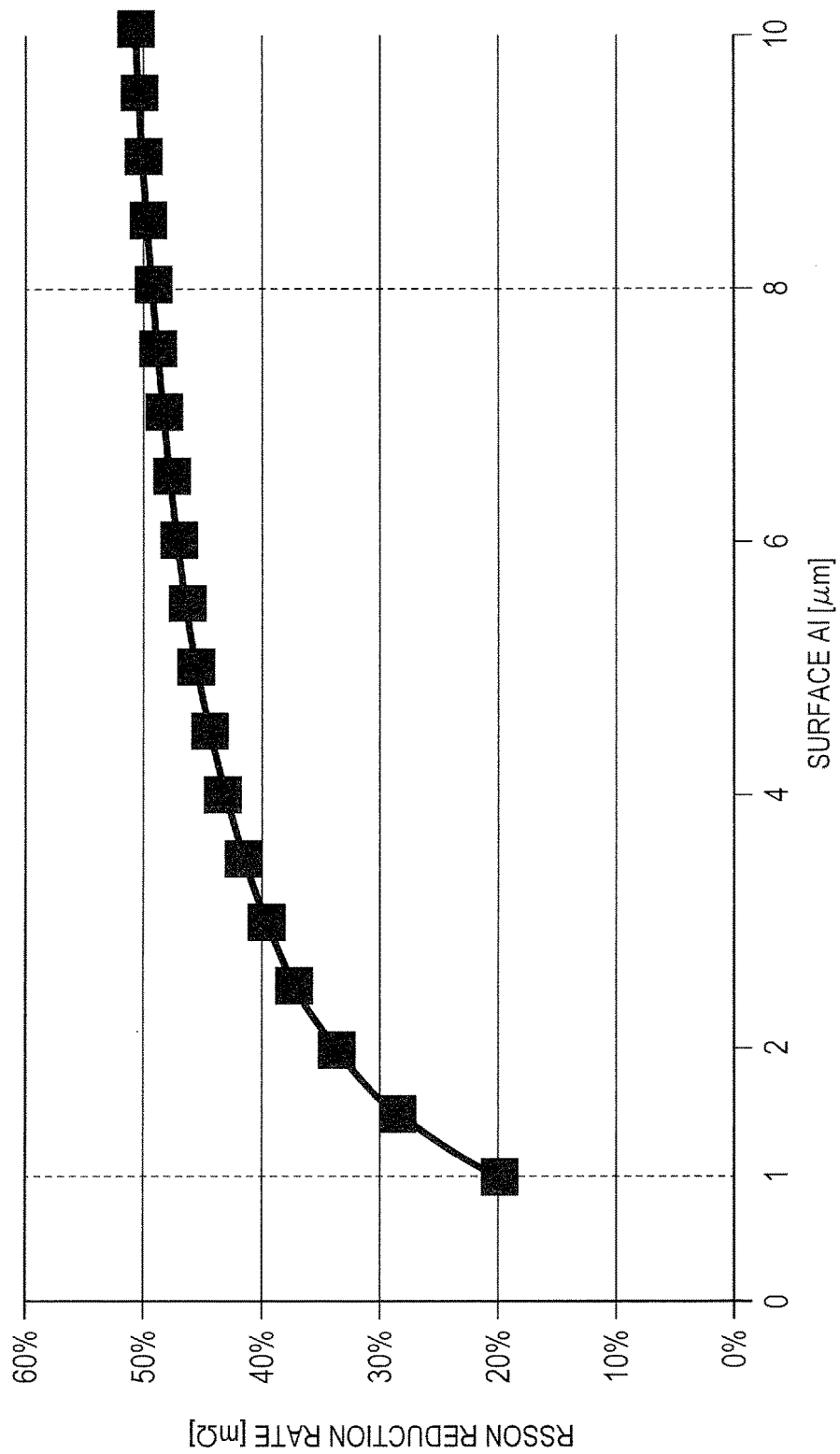
FIG. 26 is a graph showing the relationship between the thickness of an aluminum alloy film and a reduction rate in on resistance.

FIG. 26 is a graph showing the relationship between the thickness (w) of the aluminum alloy film (surface A1) and a reduction rate (RSSON reduction rate) in on resistance. As shown in FIG. 26, it is understood that the more the thickness of the aluminum alloy film is made thick, the more the reduction rate in the on resistance can be improved. Particularly, when the thickness of the aluminum alloy film is 1 µm or greater and 8 µm or less, the reduction rate in the on resistance greatly changes. From this, it is desirable that the thickness of the aluminum allow film is set to be 1 µm or greater and 8 µm or less from the viewpoint of effectively realizing the reduction rate in the on resistance with respect to thickening of the film thickness.

Figure 27:
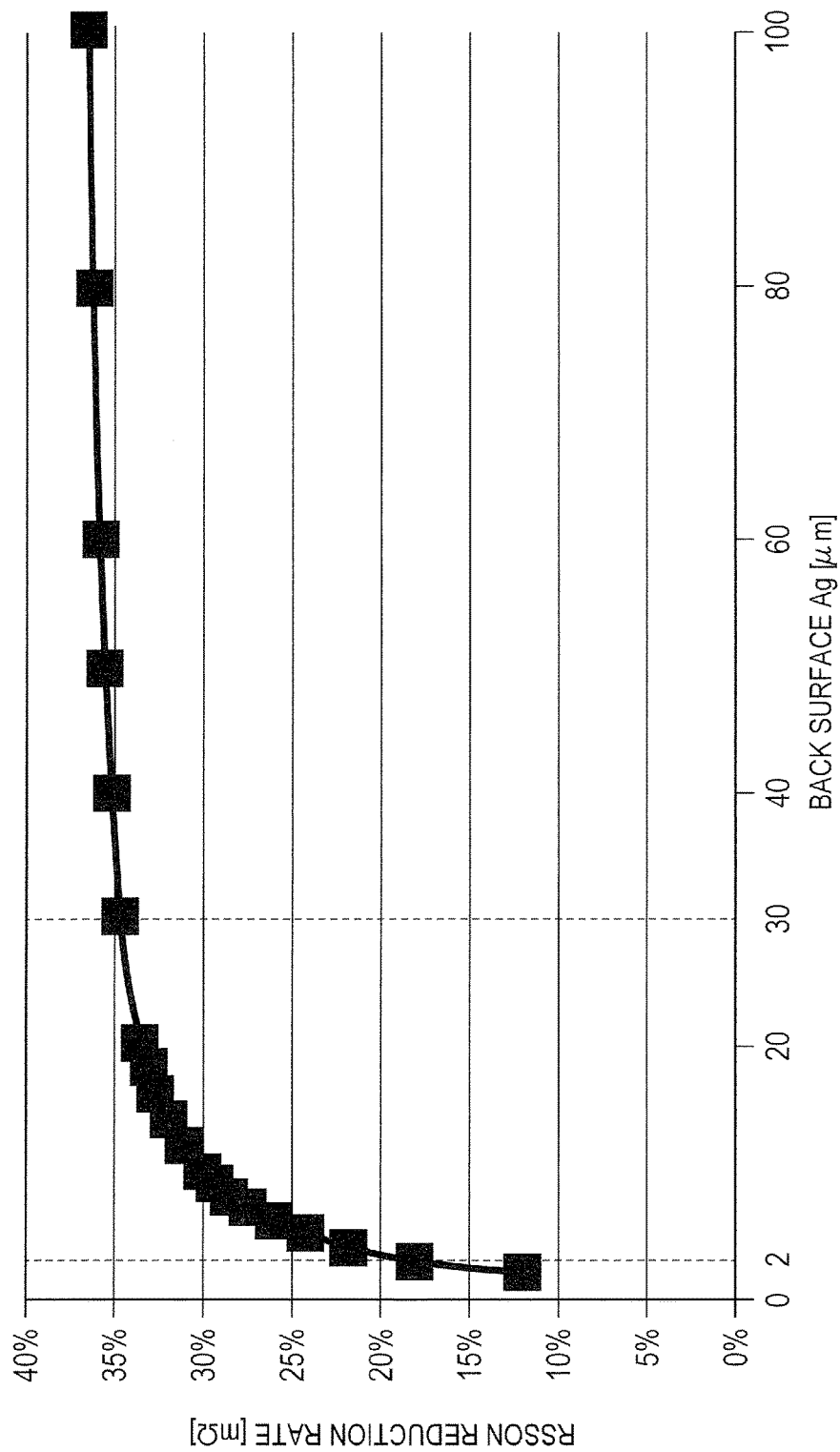
FIG. 27 is a graph showing the relationship between the thickness of a silver film and a reduction rate in on resistance.

Further, FIG. 27 is a graph showing the relationship between the thickness (µm) of a silver film (back surface Ag) and a reduction rate (RSSON reduction rate) in on resistance. As shown in FIG. 27, it is understood that the more the thickness of the silver film is made thick, the more the reduction rate in the on resistance can be improved. Particularly, when the thickness of the silver film is 2 µm or greater and 30 µm or less, the reduction rate in the on resistance greatly changes. From this, it is desirable that the thickness of the silver film is set to be 2 µm or greater and 30 µm or less from the viewpoint of effectively realizing the reduction rate in the on resistance with respect to thickening of the film thickness.

<Usability of Bidirectional CSP in the Present Embodiment> (Supplement 2)

Figure 28:
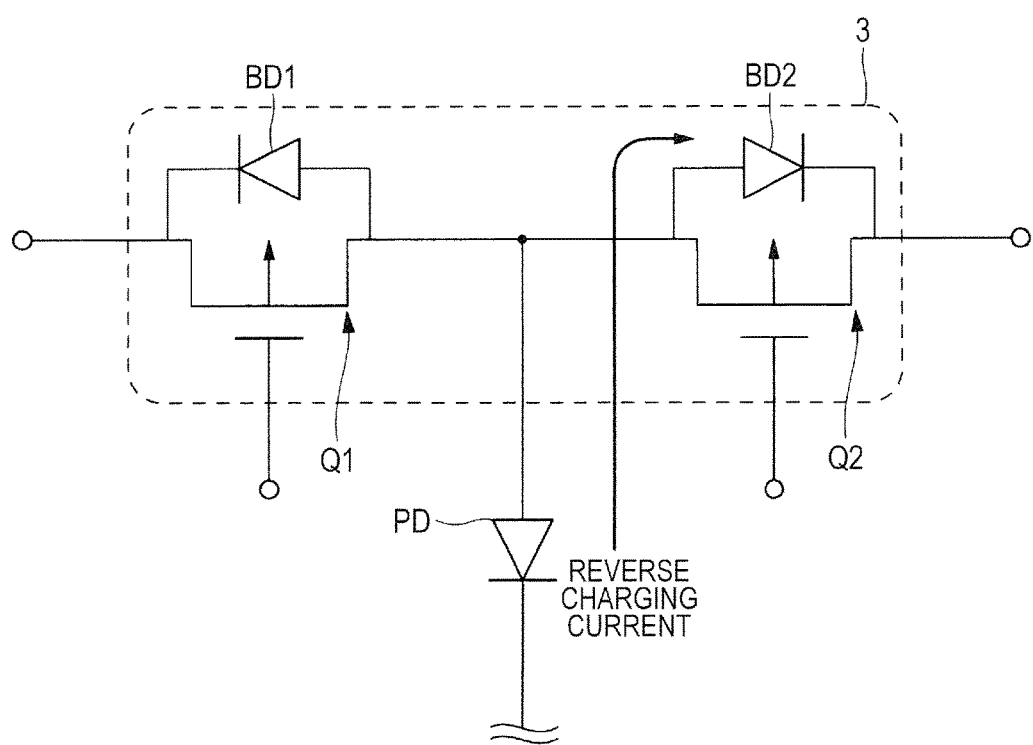
FIG. 28 is a circuit diagram showing a circuit configuration of a bidirectional CSP using p channel type power transistors.

Although the bidirectional CSP1 using the n channel type power transistors has been adopted in the present embodiment as shown in FIG. 7, for example, a bidirectional CSP3 using p channel type power transistors can also be considered as shown in FIG. 28, for example. In this case, however, the direction of a body diode BD of a charging power transistor becomes a forward direction with respect to a reverse charging current. Therefore, when a protection diode PD is broken, it is not possible to cut off the reverse charging current by a body diode BD2. That is, the bidirectional CSP3 using the p channel type power transistors is not capable of realizing the function of cutting off the reverse charging currents in dual form as in the present embodiment. That is, in the present embodiment, the function of cutting off the reverse charging currents in dual form can be realized because the bidirectional CSP1 using the n channel power transistors is adopted. This point brings about the usability of adopting the bidirectional CSP1 using the n channel power transistors.

<Modification>

Although the embodiment has described the example in which the semiconductor chip CHP1 having such a common drain pad DP as shown in FIG. 12, for example is applied to the bidirectional CSP included in the battery pack, the technical idea in the embodiment is not limited to it, but can be applied to a wide range of circuits.

Figure 29:
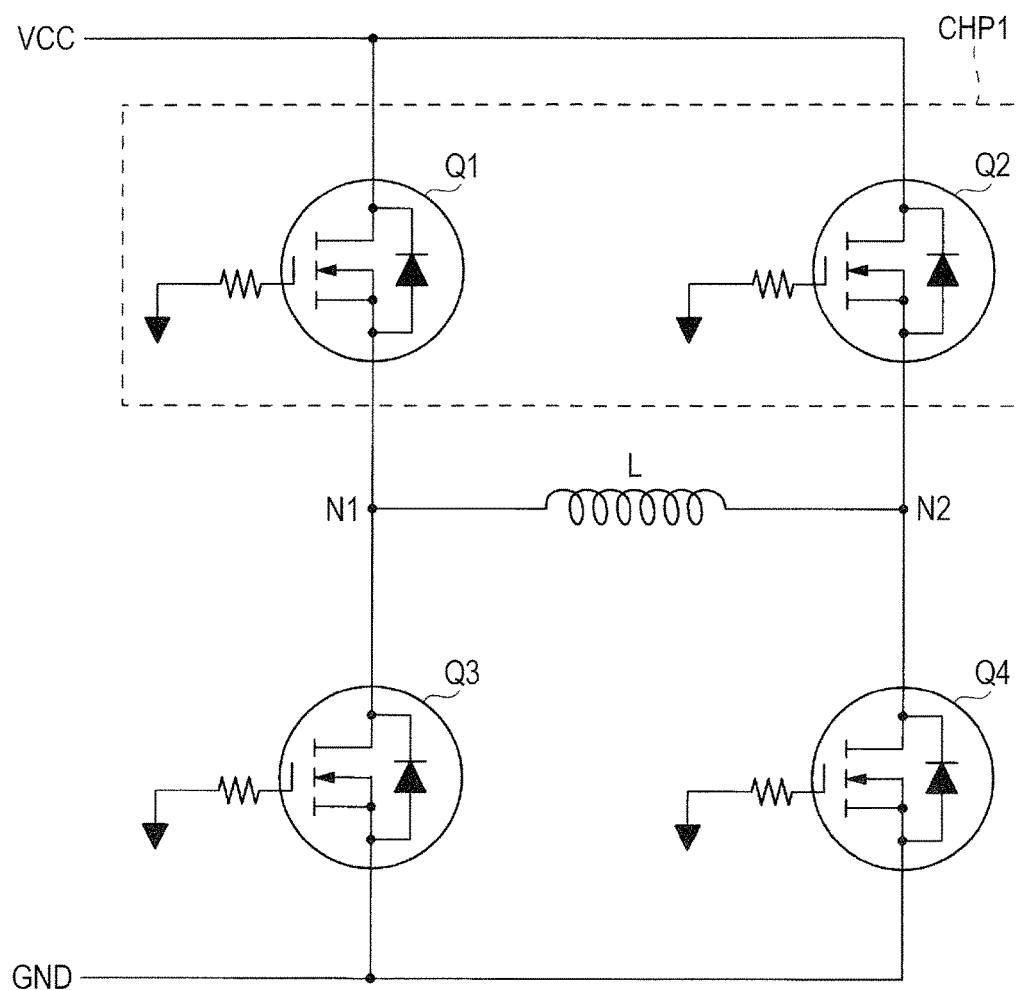
FIG. 29 is a circuit diagram showing a configuration of an H bridge circuit in a modification.

FIG. 29 is a circuit diagram showing an H bridge circuit. As shown in FIG. 29, the H bridge circuit has power transistors Q1 to Q4. The power transistor Q1 and the power transistor Q2 respectively configure a high-side switch arranged on the power supply line VCC side. The power transistor Q3 and the power transistor Q4 respectively configure a low-side switch arranged on the ground line GND side. Specifically, in the H bridge circuit, the power transistor Q1 and the power transistor Q3 are coupled in series, and the power transistor Q2 and the power transistor Q4 are coupled in series. Then, a combination of the series-coupled power transistors Q1 and Q3 and a combination of the series-coupled power transistors Q2 and Q4 are coupled in parallel with each other. Further, in the H bridge circuit, an inductance L is coupled between a node N1 between the power transistor Q1 and the power transistor Q3 and a node N2 between the power transistor Q2 and the power transistor Q4. This inductance L conceptually indicates, for example, a motor or the like.

The H bridge circuit in the present modification is configured as described above. When paying attention to the power transistor Q1 and the power transistor Q2 respectively configuring the high-side switch, for example, a drain of the power transistor Q1 and a drain of the power transistor Q2 are coupled to the power supply line VCC with each other as is apparent from FIG. 29. Thus, the power transistor Q1 and the power transistor Q2 which respectively configure the high-side switch of the H bridge circuit can utilize the semiconductor chip CHP1 having the common drain pad DP shown in FIG. 12. This is because the drains of the two power transistors formed in the semiconductor chip CHP1 are electrically coupled by the common drain pad DP and are couplable to the external circuit (power supply line VCC in the H bridge circuit) through the common drain pad.

Thus, the semiconductor chip CHP1 having such a common drain pad DP as shown in FIG. 12 can be applied not only to the bidirectional CSP included in the battery pack, but also to the pair of high-side switches of such an H bridge circuit as shown in FIG. 2. The H bridge circuit is used for a control circuit and a power supply circuit of a motor, for example. That is, the H bridge circuit can be used as a circuit which functions as each of the components such as the control circuit and power supply circuit of the motor.

Figure 30:
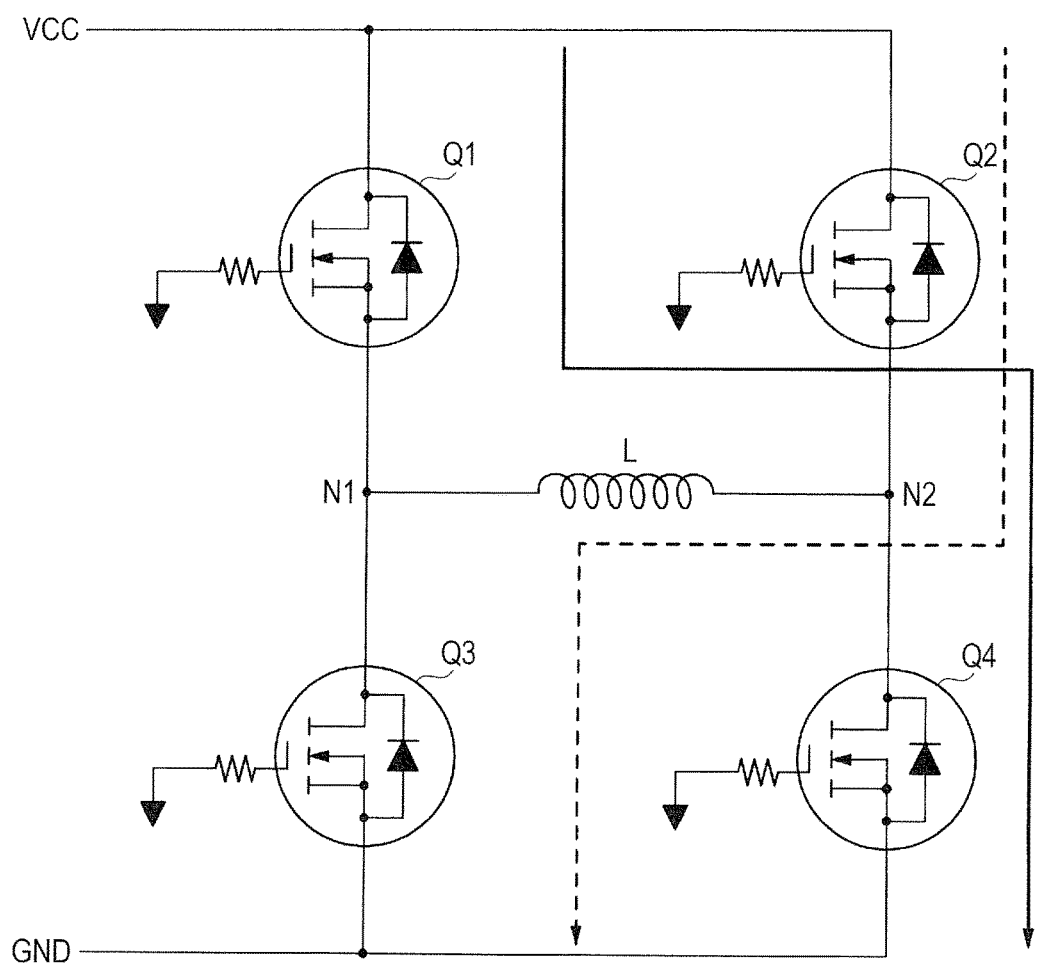
FIG. 30 is a circuit diagram for describing the operation of the H bridge circuit in the modification.

A simple operation of the H bridge circuit in the present modification will next be described. FIG. 30 is a circuit diagram for describing the operation of the H bridge circuit in the present modification. In FIG. 30, first, the power transistor Q1 and the power transistor Q4 are turned on, and the power transistor Q2 and the power transistor Q3 are turned off. In doing so, a current (solid line) flows through a path of the power supply line VCC→power transistor Q1→node N1→inductance L→node N2→power transistor Q4→ground line GND. On the other hand, in FIG. 30, the power transistor Q1 and the power transistor Q4 are turned off, and the power transistor Q2 and the power transistor Q3 are turned on. In doing so, a current (broken line) flows through a path of the power supply line VCC→power transistor Q2→node N2→inductance L→node N1→power transistor Q3→ground line GND. That is, in the H bridge circuit, the direction of the current flowing through the inductance L can be changed by switching the turned on/off power transistors. For example, a motor will be taken as a specific example of the inductance L. When the current (solid line) flows from the node N1 to the node N2, the motor is adapted to be normally rotated, whereas when the current (broken line) flows from the node N2 to the node N1, the motor is adapted to be reversely rotated. Such an H bridge circuit can be applied to, for example, a power window for an automobile. That is, the window can be opened by normally rotating the motor by the H bridge circuit. Further, the window can be closed by reversely rotating the motor by the H bridge circuit. This example, however, indicates one example of application of the H bridge circuit. The H bridge circuit can be widely applied not only as a component of a motor control circuit but also to a component of a power supply circuit typified by an uninterruptible power supply, etc. Thus, it is understood that since the semiconductor chip CHP1 having such a common drain pad DP as shown in FIG. 12 can be used as the pair of high-side switches of the H bridge circuit having a wide range of applications, the usability of the semiconductor chip CHP1 is high.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor chip, comprising:
   a first power transistor; and
   a second power transistor coupled in series with the first power r si to by coupling each drain of the first and the second transistors,
   wherein the semiconductor chip further comprises on a surface of the semiconductor chip:
      a first source pad which functions as a first source of the first power transistor;
      a first gate pad which functions as a first gate of the first power transistor;
      a second source pad which functions as a second source of the second power transistor;

a second gate pad which functions as a second gate of the second power transistor; and a common drain pad which functions as a first drain of the first power transistor and functions as a second drain of the second power transistor, wherein each of the first power transistor and the second power transistor includes a vertical transistor which causes a current to flow in a thickness direction of the semiconductor chip, wherein a component which functions as the first drain includes a semiconductor substrate and an epitaxial layer formed over the semiconductor substrate, wherein a component which functions as the second drain includes the semiconductor substrate and the epitaxial layer formed over the semiconductor substrate, and wherein an impurity concentration of a common drain extraction region coupled to the common drain pad through a plug and formed at a position to overlap with the common drain pad, in a plan view, is higher than an impurity concentration of the epitaxial layer.

2. The semiconductor chip according to claim 1, wherein the common drain extraction region is included in the common drain pad in the plan view.

3. The semiconductor chip according to claim 1, wherein, in the plan view, a boundary line between the common drain extraction region and the epitaxial layer includes at least a pair of opposed lines opposite to each other, and a single crossing line which connects the pair of opposed lines.

4. The semiconductor chip according to claim 1, wherein the common drain extraction region is surrounded by the epitaxial layer in the plan view.

5. A semiconductor chip, comprising:

a first power transistor; and a second power transistor coupled in series with the first power transistor by coupling each drain of the first and the second transistors, wherein the semiconductor chip further comprises on a surface of the semiconductor chip;

a first source pad which functions as a first source of the first power transistor;

a first gate pad which functions as a first gate of the first power transistor;

a second source pad which functions as a second source of the second power transistor;

a second gate pad which functions as a second gate of the second power transistor; and a common drain pad which functions as a first drain of the first power transistor and functions as a second drain of the second power transistor, wherein the surface of the semiconductor chip includes a first side and a second side opposite to each other, and wherein the common drain pad is arranged in a position where a distance between the first side and the common drain pad is shorter than a distance between the second side and the common drain pad.

6. The semiconductor chip according to claim 5, wherein the common drain pad is arranged in a position to be in contact with the first side.

* * * * *